(12) United States Patent
Sano et al.

(10) Patent No.: US 8,235,001 B2
(45) Date of Patent: Aug. 7, 2012

(54) SUBSTRATE PROCESSING APPARATUS AND METHOD FOR MANUFACTURING SEMICONDUCTOR DEVICE

(75) Inventors: Atsushi Sano, Toyama (JP); Hideharu Itatani, Nanto (JP); Mitsuro Tanabe, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1009 days.

(21) Appl. No.: 12/076,508

(22) Filed: Mar. 19, 2008

(65) Prior Publication Data

US 2008/0264337 A1 Oct. 30, 2008

(30) Foreign Application Priority Data

Apr. 2, 2007 (JP) ................................. 2007-096034
Mar. 7, 2008 (JP) ................................. 2008-57741

(51) Int. Cl.
*C23C 16/455* (2006.01)
*C23C 16/52* (2006.01)
*C23C 16/06* (2006.01)
*C23C 16/22* (2006.01)

(52) U.S. Cl. ... 118/696; 118/715; 118/695; 156/345.24; 156/345.26; 156/345.29

(58) Field of Classification Search .................. 118/696, 118/715, 695; 156/345.24, 345.26, 345.29
See application file for complete search history.

(56) References Cited

U.S. PATENT DOCUMENTS

| | | | | |
|---|---|---|---|---|
| 4,747,367 A | * | 5/1988 | Posa | 118/715 |
| 4,761,269 A | * | 8/1988 | Conger et al. | 118/679 |
| 5,200,388 A | * | 4/1993 | Abe et al. | 505/447 |
| 5,496,408 A | * | 3/1996 | Motoda et al. | 118/715 |
| 6,287,980 B1 | * | 9/2001 | Hanazaki et al. | 438/726 |
| 6,782,907 B2 | * | 8/2004 | Kawasaki et al. | 137/12 |
| 6,787,481 B2 | | 9/2004 | Asai et al. | |
| 6,960,537 B2 | * | 11/2005 | Shero et al. | 438/775 |
| 7,011,710 B2 | * | 3/2006 | Bang et al. | 118/715 |

(Continued)

FOREIGN PATENT DOCUMENTS

JP A 2004-158811 6/2004

(Continued)

OTHER PUBLICATIONS

Korean Office Action issued in Korean Patent Application No. 10-2008-0028204 on Feb. 26, 2010 (with translation).

(Continued)

*Primary Examiner* — Rudy Zervigon
(74) *Attorney, Agent, or Firm* — Oliff & Berridge, PLC

(57) ABSTRACT

A substrate processing apparatus and a method for manufacturing a semiconductor device whereby foreign matter can be prevented from being adsorbed on the substrate, by suppressing agitation of foreign matter present in the processing chamber. The substrate processing apparatus comprises a processing chamber for processing a substrate; a processing gas feeding line for feeding a processing gas into the processing chamber; an inert gas feeding line for feeding an inert gas into the processing chamber; an inert gas vent line provided in the inert gas feeding line, for exhausting the inert gas fed into the inert gas feeding line without feeding the inert gas into the processing chamber; a first valve provided in the inert gas feeding line, on a downstream side of a part where the inert gas vent line is provided in the inert gas feeding line; a second valve provided in the inert gas vent line; and an exhaust line that exhausts an inside of the processing chamber.

14 Claims, 14 Drawing Sheets

U.S. PATENT DOCUMENTS

| | | | |
|---|---|---|---|
| 7,296,532 B2 * | 11/2007 | Cheng et al. | 118/723 MP |
| 7,666,479 B2 * | 2/2010 | Strang | 427/569 |
| 2002/0134439 A1 * | 9/2002 | Kawasaki et al. | 137/565.23 |
| 2002/0192369 A1 * | 12/2002 | Morimoto et al. | 427/248.1 |
| 2003/0000924 A1 * | 1/2003 | Strang | 216/86 |
| 2004/0118342 A1 * | 6/2004 | Cheng et al. | 118/715 |
| 2005/0223982 A1 * | 10/2005 | Park et al. | 118/715 |
| 2005/0249876 A1 * | 11/2005 | Kawahara et al. | 427/255.34 |
| 2009/0004877 A1 * | 1/2009 | Asai | 438/758 |
| 2009/0178694 A1 * | 7/2009 | Okuda et al. | 134/22.12 |

FOREIGN PATENT DOCUMENTS

| | | |
|---|---|---|
| JP | A 2004-296820 | 10/2004 |
| KR | 10-0257305 | 7/1994 |
| KR | 10-2007-0012574 | 1/2007 |
| WO | WO 2005/024926 A1 | 3/2005 |

OTHER PUBLICATIONS

Dec. 27, 2011 Office Action issued in Japanese Patent Application No. 2008-057741 (with translation).

* cited by examiner

FIG.10

|  | Source Gas Feeding Step (S5) | Purge Step (S6) | Activated Gas Feeding Step (S7) | Purge Step (S8) |
|---|---|---|---|---|
| Source Gas Feeding Duct | 0.5 | – | – | – |
| First Inert Gas Feeding Duct | – | 0.5 | 0.5 | 0.5 |
| Activated Gas Feeding Duct | – | – | 0.2 | – |
| Second Inert Gas Feeding Duct | 0.2 | 0.2 | – | 0.2 |
| Subtotal Flow Rate of Exhaust Via Processing Chamber (slm) | 0.7 | 0.7 | 0.7 | 0.7 |
| Source Gas Vent Duct | – | 0.5 | 0.5 | 0.5 |
| First Inert Gas Vent Duct | 0.5 | – | – | – |
| Activated Gas Vent Duct | 0.2 | 0.2 | – | 0.2 |
| Second Inert Gas Vent Duct | – | – | 0.2 | – |
| Subtotal Flow Rate of Exhaust Via Vent Ducts (slm) | 0.7 | 0.7 | 0.7 | 0.7 |
| Total Exhaust Flow Rate (slm) | 1.4 | 1.4 | 1.4 | 1.4 |
| Exhaust Flow Rate Ratio (Via Processing Chamber : Via Vent Ducts) | 1:1 | 1:1 | 1:1 | 1:1 |

FIG.12

|  | Source Gas Feeding Step (S5) | Purge Step (S6) |
|---|---|---|
| Source Gas Feeding Duct | 0.5 | - |
| Inert Gas Feeding Duct | - | 0.5 |
| Subtotal Flow Rate of Exhaust Via Processing Chamber (slm) | 0.5 | 0.5 |
| Source Gas Vent Duct | - | 0.5 |
| Inert Gas Vent Duct | 0.5 | - |
| Subtotal Flow Rate of Exhaust Via Vent Ducts (slm) | 0.5 | 0.5 |
| Total Exhaust Flow Rate (slm) | 1.0 | 1.0 |
| Exhaust Flow Rate Ratio (Via Processing Chamber:Via Vent Ducts) | 1:1 | 1:1 |

FIG. 14

| | Source Gas Feeding Step (S5) | Purge Step (S6) |
|---|---|---|
| Source Gas Feeding Duct | 0.5 | - |
| Dilution Inert Gas Feeding Duct | 0.2 | 0.2 |
| Inert Gas Feeding Duct | - | 0.5 |
| Subtotal Flow Rate of Exhaust Via Processing Chamber (slm) | 0.7 | 0.7 |
| Source Gas Vent Duct | - | 0.5 |
| Dilution Inert Gas Vent Duct | - | - |
| Inert Gas Vent Duct | 0.5 | - |
| Subtotal Flow Rate of Exhaust Via Vent Ducts (slm) | 0.5 | 0.5 |
| Total Exhaust Flow Rate (slm) | 1.2 | 1.2 |
| Exhaust Flow Rate Ratio (Via Processing chamber : Via Vent Ducts) | 7:5 | 7:5 |

# SUBSTRATE PROCESSING APPARATUS AND METHOD FOR MANUFACTURING SEMICONDUCTOR DEVICE

BACKGROUND OF THE INVENTION

1. Field of the Invention

The present invention relates to a substrate processing apparatus and to a method for manufacturing a semiconductor device.

2. Description of the Related Art

A case such as executing a substrate processing step of forming a thin film on a processed substrate such as a silicon wafer, is given as an example, as a step of the manufacturing step of the semiconductor device such as an LSI. Such physical vapor deposition (PVD) methods as sputtering and the like, or a chemical vapor deposition (CVD) method using a chemical reaction, for example, are sometimes performed in the substrate processing step of forming the thin film on the substrate. Since the CVD method generally possess advantages not had by the PVD method, such as step coverage characteristics, the CVD method is widely employed as a film formation method.

The substrate processing step described above is executed by a substrate processing apparatus provided with a processing chamber for processing the substrate, for example. A particularly stringent level of cleanness has come to be required in the substrate processing apparatus in conjunction with recent miniaturization of wiring formed in semiconductor devices, and reduction of the dimensions of semiconductor devices as such.

Patent Document 1: Japanese Patent Laid Open Publication No. 2004-296820

SUMMARY OF THE INVENTION

However, particles (foreign matter) that are adsorbed or the like on the processed substrate in the processing chamber of the substrate processing apparatus are sometimes carried into the processing chamber along with the substrate. Foreign matter also is sometimes adsorbed on the structural components that constitute the substrate processing apparatus, and contaminants are sometimes generated from the structural components.

Byproducts that accumulate in the processing chamber in the course of substrate processing may also participate in contamination. A film can easily form on the inside wall of the processing chamber or on members inside the processing chamber particularly during the substrate processing step of forming a thin film on the substrate, and contaminants can be formed by the peeling off of this film for various reasons. Particularly in the case of a CVD method, since film formation depends on the temperature conditions, films that cause contamination are easily formed in locations (for example, the inside wall of the processing chamber, members inside the processing chamber, and elsewhere) other than on the substrate under adequate temperature conditions. Contamination can also be caused by vapor-phase reactions of gases introduced into the processing chamber when a CVD method is used.

This foreign matter inside the processing chamber can be agitated during substrate processing and scattered inside the processing chamber, and is sometimes adsorbed on the substrate being processed. A semiconductor device that is manufactured on a substrate on which foreign matter is adsorbed may have poor performance, short service life, or poor production yield.

Therefore, in view of the problems described above, an object of the present invention is to provide a substrate processing apparatus and a method for manufacturing a semiconductor device whereby foreign matter can be prevented from being adsorbed on the substrate, by suppressing agitation of foreign matter present in the processing chamber.

An aspect of the present invention provides a substrate processing apparatus comprising a processing chamber for processing a substrate; a processing gas feeding line for feeding a processing gas into the processing chamber; an inert gas feeding line for feeding an inert gas into the processing chamber; an inert gas vent line provided in the inert gas feeding line, for exhausting the inert gas fed into the inert gas feeding line without feeding the inert gas into the processing chamber; a first valve provided in the inert gas feeding line, on a downstream side of a part where the inert gas vent line is provided in the inert gas feeding line; a second valve provided in the inert gas vent line; and an exhaust line that exhausts an inside of the processing chamber.

Another aspect of the present invention provides a method for manufacturing a semiconductor device comprising loading a substrate into a processing chamber; processing the substrate in the processing chamber; and unloading the substrate from the processing chamber after processing; wherein, in the processing the substrate, feeding a first processing gas into the processing chamber through a first processing gas feeding line, feeding inert gas into the processing chamber through an inert gas feeding line, feeding a second processing gas into the processing chamber through a second processing gas feeding line, and feeding the inert gas into the processing chamber through said inert gas feeding line, are set as one cycle, and this cycle is repeated multiple number of times, and in the feeding the first processing gas and the feeding the second processing gas, the inert gas fed into the inert gas feeding line is exhausted through an inert gas vent line provided in the inert gas feeding line without being fed into the processing chamber, and in the feeding the inert gas, a flow of the inert gas fed into said inert gas feeding line is switched from the flow toward the inert gas vent line to the flow toward an inside of the processing chamber.

The present invention makes it possible to provide a substrate processing apparatus and a method for manufacturing a semiconductor device whereby foreign matter can be prevented from being adsorbed on the substrate, by suppressing agitation of foreign matter present in the processing chamber.

BRIEF DESCRIPTION OF THE DRAWINGS

FIG. 4 is a graph showing an example of the sequence of feeding processing gas into the processing chamber, wherein FIG. 4A shows an example of the conventional sequence, and FIG. 4B shows an example of the sequence in the first embodiment of the present invention;

FIG. 5 is a graph showing an example of the sequence of feeding processing gas into the processing chamber, wherein FIG. 5A shows an example of the sequence in the second embodiment of the present invention, and FIG. 5B shows an example of the sequence in the second embodiment of the present invention;

FIG. 10 is a table showing the flow rates of the various types of gas in the cyclic processing of the fourth embodiment of the present invention;

FIG. 12 is a table showing the flow rates of the various types of gas in the cyclic processing of the fifth embodiment of the present invention;

FIG. 14 is a table showing the flow rates of the various types of gas in the cyclic processing of the sixth embodiment of the present invention.

DESCRIPTION OF THE PREFERRED EMBODIMENTS

In the conventional technique as described above, it has often been the case that a film is easily formed not only on the substrate being processed, but also on the inside wall of the processing chamber or on members inside the processing chamber during the substrate processing step of forming a thin film on the substrate, and contaminants can be formed by the peeling off of this film for various reasons. Particularly in the case of a CVD method, films that cause contamination have easily formed in locations other than on the substrate under adequate temperature conditions. As described above, the foreign matter inside the processing chamber is sometimes agitated during substrate processing and scattered inside the processing chamber, and is sometimes adsorbed on the substrate being processed. As a result, a semiconductor device that is manufactured on a substrate on which foreign matter is adsorbed may have poor performance, short service life, or poor production yield.

The inventors therefore conducted a concentrated investigation of the causes of foreign matter agitation inside the processing chamber. As a result, the inventors learned that pressure fluctuations within the processing chamber during the substrate processing step agitate foreign matter that occurs in the processing chamber, and are thus one cause of foreign matter being adsorbed on the substrate being processed. The inventors also discovered that suppressing the occurrence of pressure fluctuations in the processing chamber during the substrate processing step is effective in suppressing the agitation of foreign matter that occurs in the processing chamber, and thus developed the present invention.

Embodiments of the present invention will be described hereinafter with reference to the drawings.

1. First Embodiment of the Present Invention

The structure of a processing oven 202 of a substrate processing apparatus as the first embodiment of the present invention, a substrate processing step performed through the use of the processing oven 202 as a step in a semiconductor device manufacturing process, and an example of the cyclic processing performed in the substrate processing step will be described in sequence hereinafter.

(1) STRUCTURE OF THE PROCESSING OVEN

Figure 1:
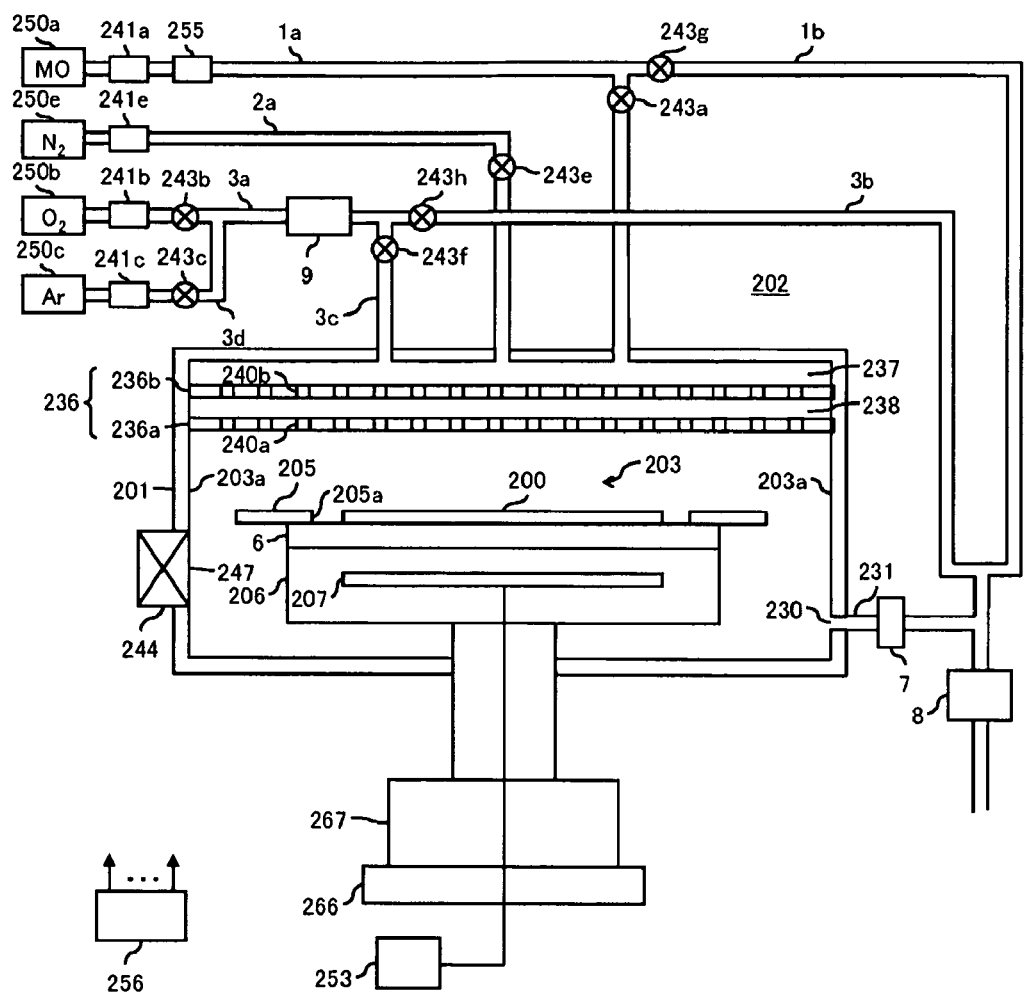
FIG. 1 is a schematic view showing the system structure of the processing oven of the substrate processing apparatus in the first embodiment of the present invention.

The structure of the processing oven 202 of the substrate processing apparatus as the first embodiment of the present invention will first be described using FIG. 1. FIG. 1 is a schematic view showing an example of the processing oven of a single-wafer MOCVD device, which is the substrate processing apparatus according to the first embodiment of the present invention.
Processing Vessel The processing oven 202 according to the present embodiment is provided with a processing vessel 201. The processing vessel 201 is composed of a metal vessel made of aluminum (Al) stainless steel (SUS), or the like, for example. A processing chamber 203 for processing a substrate 200 is formed within the processing vessel 201. The substrate 200 may be a semiconductor silicon wafer, a compound semiconductor wafer, or a glass substrate, for example.
Substrate Conveyance port A substrate conveyance port 247 for loading and unloading the substrate 200 into and from the processing chamber 203 is provided below the processing chamber side wall 203a. The substrate conveyance port 247 is structured so as to open and close in response to a gate valve 244. The substrate conveyance port 247 is structured so that airtightness is maintained within the processing chamber 203 by the closing of the gate valve 244.
Substrate Support Unit A hollow heater unit 206 is provided within the processing chamber 203. The upper opening of the heater unit 206 is covered by a susceptor 6 as a substrate support unit (support plate). A heater 207 as a heating unit (heating mechanism) is placed inside the hollow heater unit 206. The heater 207 makes it possible to heat the substrate 200 mounted on the susceptor 6. The heater 207 is controlled by a temperature controller 253 as a temperature control unit (temperature control instrument) so that the substrate 200 is at a prescribed temperature. The hollow heater unit 206 can be formed integrally with the heater 207 insofar as the substrate 200 can be heated.

The lower part of the heater unit 206 is provided so as to penetrate through the bottom part of the processing vessel 201, while airtightness is maintained within the processing chamber 203 (*1). A lower end portion of the heater unit 206 is supported from below by a rotation mechanism 267 as a rotation unit. Accordingly, through the operation of the rotation mechanism 267, the heater unit 206 within the processing chamber 203 can be rotated, and the substrate 200 on the susceptor 6 can be rotated. The substrate 200 is rotated in order for the processing applied to the substrate 200 to be rapidly and uniformly performed in the plane of the substrate 200 in the below-described step (source gas feeding step or activated gas feeding step) of feeding the processing gases. It is also possible to omit the rotation unit when the desired degree of uniformity can be obtained without rotating the substrate 200.

An elevator mechanism 266 is provided below the rotation mechanism 267. The elevator mechanism 266 supports the rotation mechanism 267 from below. Through the operation of the elevator mechanism 266, the rotation mechanism 267 and the heater unit 206 can be raised and lowered, and the substrate 200 on the susceptor 6 can be raised and lowered within the processing chamber 203. For example, when the substrate 200 is loaded and unloaded with respect to the processing chamber 203, the heater unit 206 is moved (lowered) to a substrate conveyance position in the lower portion inside the processing chamber 203. When a substrate process such as forming a film on the substrate 200 is performed, the heater unit 206 is moved (elevated) to a substrate processing position that is higher than the substrate conveyance position.

First Processing Gas Feeding Line (Source gas Feeding line)

A film-forming source material feeding unit 250a that feeds an organic liquid source material (MO (Metal Organic) source material) as a film-forming source material that provides the basis for the source gas as the first processing gas; a liquid mass flow controller 241a as a flow rate control unit (liquid flow rate controller) that controls the liquid feeding rate of the film-forming source material; and a vaporizer 255 for vaporizing the film-forming source material are provided to the outside of the processing chamber 203.

The film-forming source material feeding unit 250a, the liquid mass flow controller 241a, and the vaporizer 255 are serially connected by a source gas supply duct 1a, which is a first processing gas feeding line (source gas feeding line). The organic liquid source material (MO source material) is fed to the vaporizer 255 from the film-forming source material feeding unit 250a via the mass flow controller 241a, and the organic liquid source material is vaporized by the vaporizer 255, whereby the source gas can be obtained.

The downstream side of the vaporizer 255 is connected via the source gas supply duct 1a to a shower head 236 (described hereinafter) that is provided in the upper portion of the processing chamber 203. A valve 243a is provided between the shower head 236 and the vaporizer 255 of the source gas feeding duct 1a, and the introduction (feeding) of the source gas into the processing chamber 203 can be controlled by opening and closing the valve 243a. Nitrogen gas or another inert gas, for example, is sometimes used as a carrier gas when the source gas is introduced into the processing chamber 203. The source gas is used in the source gas feeding step that is described below.

Inert Gas Feeding Line

An inert gas feeding unit 250e that feeds the non-reactive inert gas, and a mass flow controller 241e as a flow rate control unit (flow rate controller) that controls the rate of feeding the inert gas are provided to the outside of the processing chamber 203. The inert gas used may be Ar, He, $N_2$, or the like, for example.

The inert gas feeding unit 250e and the mass flow controller 241e are serially connected by an inert gas feeding duct 2a, which is a line for feeding inert gas.

The downstream side of the mass flow controller 241e is connected to a shower head 236 at the top part of the processing chamber 203 via the inert gas feeding duct 2a. A valve 243e is provided between the shower head 236 and the mass flow controller 241e of the inert gas feeding duct 2a, and introduction (feeding) of the inert gas into the processing chamber 203 can be controlled by opening and closing the valve 243e. The source gas is used in the purge step described below.

Reaction Gas Feeding Line

A reaction gas feeding unit 250b that feeds a reaction gas that provides the basis for the activated gas as the second processing gas; a mass flow controller 241b as a flow rate control unit (flow rate controller) that controls the feeding rate of the reaction gas; and an activation mechanism 9 as an activation unit for activating the reaction gas are provided to the outside of the processing chamber 203.

Examples of the gas used as the reaction gas are oxygen, ozone, and other oxygen-containing gases that act as oxidizing agents for reacting with the source gas. In rare cases, namely, cases where it is desirable to remove impurities from the film such as C (carbon) without oxidizing the formed film, as in the case of wiring, for example, a reducing agent such as $NH_3$ or $H_2$ is used.

The reaction gas feeding unit 250b, the mass flow controller 241b, and the activation mechanism 9 are serially connected by a reaction gas feeding duct 3a. A valve 243b is provided between the mass flow controller 241b and the activation mechanism 9, and the introduction (feeding) of reaction gas into the activation mechanism 9 can be controlled by opening and closing the valve 243b.

The activation mechanism 9 is structured, for example, as a remote plasma unit for activating the reaction gas by a plasma, or as an ozonizer for generating ozone. For example, when the activation mechanism 9 is structured as a remote plasma unit, an Ar gas feeding unit 250c that feeds Ar gas as a plasma ignition gas for producing a plasma, and a mass flow controller 241c as a flow rate control unit that controls the feeding rate of Ar gas are provided on the upstream side of the activation mechanism 9. The Ar gas feeding unit 250c and the mass flow controller 241c are serially connected by an Ar gas feeding duct 3d as a feeding line for Ar gas. The downstream side of the mass flow controller 241c is connected via the Ar gas feeding duct 3d to a portion further downstream (i.e., between the activation mechanism 9 and the valve 243b) than the valve 243b of the reaction gas feeding duct 3a. A valve 243c is provided between the activation mechanism 9 and the mass flow controller 241c of the Ar gas feeding duct 3d, and the introduction (feeding) of Ar gas to the activation mechanism 9 can be controlled by opening and closing the valve 243c.

Activated gas containing oxygen radicals or the like can be obtained in the activation mechanism 9 by feeding Ar gas to the activation mechanism 9 from the Ar gas feeding unit 250c via the mass flow controller 241c, generating Ar plasma in the activation mechanism 9, feeding an oxidizing agent such as oxygen gas ($O_2$) as the reaction gas from the reaction gas feeding unit 250b to the activation mechanism 9 via the mass flow controller 241b, and causing the reaction gas to be activated by the Ar plasma generated in the activation mechanism 9. When the activation mechanism 9 is structured as an ozonizer, an activated gas containing ozone can be obtained in the activation mechanism 9 by feeding $O_2$ from the reaction gas feeding unit 250b to the activation mechanism 9 via the mass flow controller 241b. The activated gas obtained by activating the reaction gas is used in the activated gas feeding step described hereinafter.

Second Processing Gas Feeding Line (Activated Gas Feeding Line)

The downstream side of the activation mechanism 9 is connected to the shower head 236 at the top portion of the processing chamber 203 by an activated gas feeding duct 3c that functions as a second processing gas feeding line (activated gas feeding line). A valve 243f is provided in the activated gas feeding duct 3c, and the introduction into the processing chamber 203 of an activated gas that contains oxygen radicals, ozone, or the like can be controlled by opening or closing the valve 243f. The activated gas that contains oxygen radicals, ozone, or the like is used in the activated gas feeding step described hereinafter.

Shower Head

The shower head 236 is provided in the upper portion of the processing chamber 203. The shower head 236 is provided with a dispersion plate 236b in which a plurality of ventilation holes (through-holes) 240b is provided, and with a shower plate 236a in which a plurality of ventilation holes (through-holes) 240a is provided. The dispersion plate 236b is disposed so as to face the ceiling surface of the shower head 236; i.e., so as to face the introduction vent of the source gas supply duct 1a, the introduction vent of the inert gas feeding duct 2a, and the introduction vent of the activated gas feeding duct 3c. The shower plate 236a is disposed downstream of the dispersion plate 236b so as to face the dispersion plate 236b and also to face the susceptor 6. A buffer space 237 is provided between the dispersion plate 236b and the upper portion (ceiling portion) of the shower head 236, and a buffer space 238 is provided between the dispersion plate 236b and the shower plate 236a.

The shower head 236 provided in the upper portion of the processing chamber 203 has a feeding vent for dispersing the gas fed into the processing chamber 203 from the source gas supply duct 1a, the activated gas feeding duct 3c, and the inert gas feeding duct 2a and uniformly feeding gas to the substrate 200, which is placed in the substrate processing position, in the source gas feeding step, the activated gas feeding step, and the purge step described hereinafter.

Exhaust Vent

An exhaust vent 230 for exhausting gas from the inside of the processing chamber 203 is provided in the bottom portion of the processing chamber side wall 203a, on the side opposite from the substrate conveyance port 247. The exhaust vent 230 is connected to an exhaust pump 8 as an exhaust device, via an exhaust duct 231 as an exhaust gas line. For example, an APC (Auto Pressure Controller) or other pressure control unit 7 that controls the pressure within the processing chamber 203 is positioned between the exhaust vent 230 and the exhaust gas pump 8. The downstream side of the exhaust pump 8 is communicated with a scrubber apparatus. The exhaust vent 230 and the exhaust duct 231 constitute an exhaust system.

Baffle Plate

A baffle plate 205 is mounted on the susceptor 6 as a substrate support unit (support plate). An opening 205a for exposing the substrate 200 mounted on the susceptor 6 is provided to the inside of the baffle plate 205, and the baffle plate 205 has a ring shape. The gas fed from the shower head 236 to the substrate 200 in the substrate processing position passes through the space between the processing chamber side wall 203a and the external peripheral part of the baffle plate 205, and is exhausted through the exhaust vent 230 to the outside of the processing chamber 203. The space between the processing chamber side wall 203a and the external peripheral part of baffle plate 205 is set to a size whereby the gas fed from the shower head 236 is uniformly fed onto the substrate 200.

When a film is not to be formed at certain locations in, for example, the external peripheral part or other parts of the substrate 200, the baffle plate 205 may be made to function in preventing film formation on the substrate 200. Specifically, a structure may be adopted in which the opening 205a of the baffle plate 205 has a small diameter, and the external peripheral portion of the substrate 200 is covered (masked) from above the substrate 200 by the inside portion of the baffle plate 205 during film formation. In this case, the substrate can be conveyed since the substrate 200 is positioned between the susceptor 6 and the baffle plate 205, and a structure may therefore be adopted in which the baffle plate 205 is fixed in advance at the height of the substrate processing position inside the processing chamber 203, for example, and the susceptor 6 on which the substrate 200 is mounted is raised from the lower part of the baffle plate 205. A structure may also be adopted in which a mechanism for raising and lowering the baffle plate 205 is provided, and the baffle plate 205 is lowered from above the substrate 200 mounted on the susceptor 6.

Vent Line

A source gas vent (bypass) duct 1b is provided as a first processing gas vent line (source gas vent line) on the upstream side (i.e., between the vaporizer 255 and the valve 243a) of the valve 243a of the source gas feeding duct 1a. The source gas vent duct 1b is connected between the exhaust gas pump 8 and the pressure control unit 7 of the exhaust duct 231 via a valve 243g.

An activated gas vent (bypass) duct 3b is provided as a second processing gas vent line (reaction gas vent line) on the upstream side (i.e., between the activation mechanism 9 and the valve 243f) of the valve 243f of the activated gas feeding duct 3c. The activated gas vent duct 3b is connected between the exhaust gas pump 8 and the pressure controller 7 of the exhaust duct 231 via a valve 243h.

Controller

The substrate processing apparatus is provided with a main controller 256 that controls the operation of the valves 243a through 243h, the mass flow controllers 241a through 241e, the temperature controller 253, the pressure control unit 7, the vaporizer 255, the activation mechanism 9, the rotation mechanism 267, the elevator mechanism 266, and other components that constitute the substrate processing apparatus. The main controller 256 performs control so that feeding the source gas, feeding the activated gas, and purging described hereinafter are continuously repeated a multiple number of times by controlling such functions as the opening and closing of the aforementioned valves.

(2) SUBSTRATE PROCESSING STEP

Figure 7:
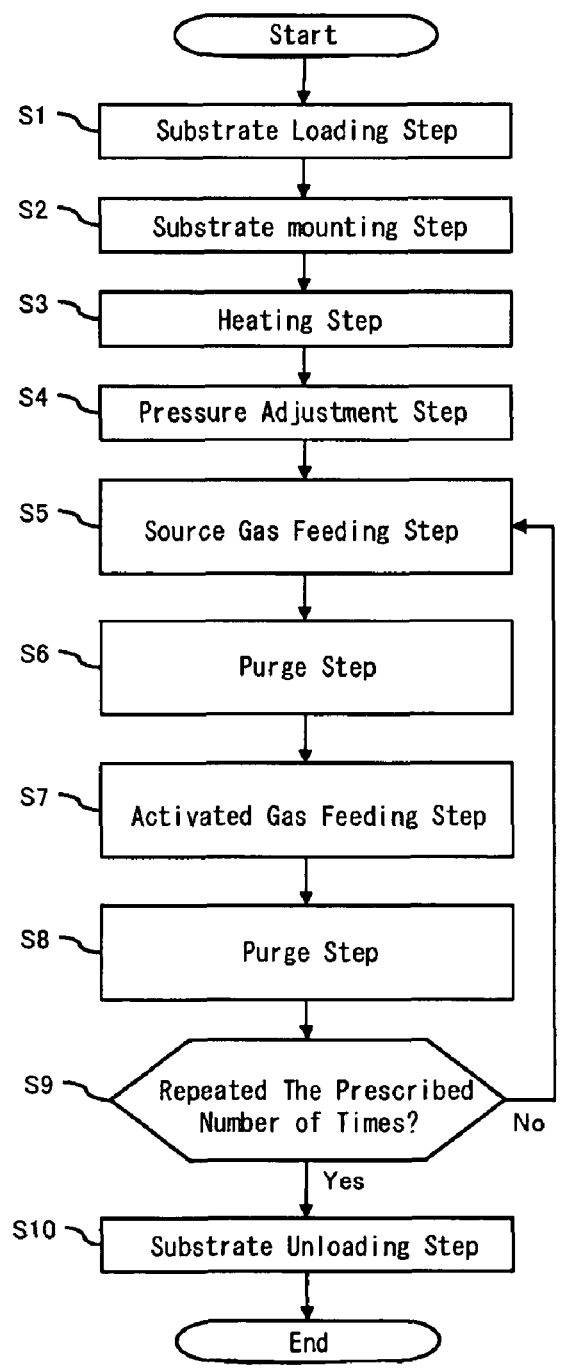
FIG. 7 is a flowchart showing the substrate processing step in the first embodiment of the present invention executed as a step of the semiconductor device manufacturing process.

The procedure whereby a thin film is deposited on the substrate 200 as the substrate processing step according to the first embodiment of the present invention will next be described with reference to FIG. 7. The substrate processing step according to the first embodiment is executed by the processing oven of the previously described substrate processing apparatus as one step of a process for manufacturing a semiconductor device. In the description that follows, the operations of the parts constituting the substrate processing apparatus are controlled by the main controller 256.

Substrate Loading Step

The heater unit 206 shown in FIG. 1 is first lowered to the substrate conveyance position. The gate valve 244 is then opened, and the substrate conveyance port 247 is opened. The substrate 200 is then loaded into the processing chamber 203 by a wafer loader (S1).

Substrate Mounting Step

The substrate 200 loaded into the processing chamber 203 is then placed on push-up pins not shown in the drawing. The gate valve 244 is then closed and the processing chamber 203 is sealed. The heater unit 206 is then raised from the substrate conveyance position to the higher substrate processing position. The substrate 200 is thereby transferred onto the susceptor 6 from the push-up pins (S2).

Heating Step

The voltage fed to the heater 207 is then controlled so that the substrate 200 is uniformly heated to a prescribed temperature while being rotated by the substrate rotation unit (S3).

Pressure Adjustment Step

At the same time that the heating step is being conducted, the inside of the processing chamber 203 is exhausted to a vacuum by the exhaust gas pump 8 (S4). This step is controlled by the pressure controller 7 so that a prescribed processing pressure is obtained in the processing chamber 203. Adsorption of particles (foreign matter) or metal contaminants on the substrate 200 can be prevented when the valve 243e provided in the inert gas feeding duct 2a is opened and an inert gas such as Ar, He, or $N_2$, is exhausted through the exhaust duct 231 while being continually circulated in the processing chamber 203 during conveyance or heating of the substrate 200.

Source Gas Feeding Step

Once the temperature of the substrate 200 and the pressure within the processing chamber 203 have reached the prescribed processing temperature and the prescribed processing pressure and have stabilized, the source gas as the first processing gas is fed into the processing chamber 203 (S5).

Specifically, the organic liquid source material (MO source material) as the film-forming source material for forming the basis of the source gas as the first processing gas is fed from the film-forming source material feeding unit 250a to the vaporizer 255 while the flow rate of the source gas is controlled by the liquid mass flow controller 241a, and the organic liquid source material is vaporized by the vaporizer 255 to generate the source gas. The valve 243a provided in the source gas supply duct 1a is then opened, and the source gas generated by the vaporizer 255 is fed onto the substrate 200 via the shower head 236. At this time, the valve 243g provided in the source gas vent duct 1b is closed. When the source gas is fed into the processing chamber 203, the valve 243e is opened, and the inert gas ($N_2$ or the like) is allowed to continually flow from the inert gas feeding unit 250e so as to stir the source gas that is being fed into the processing chamber 203. The reason for this is that the source gas becomes easier to stir when diluted by the inert gas.

The source gas fed from the source gas feeding duct 1a and the inert gas fed from the inert gas feeding duct 2a are mixed in the buffer space 237 of the shower head 236, are directed into the buffer space 238 through the plurality of holes 240b provided in the dispersion plate 236b, and are fed in the form of a shower onto the substrate 200 on the susceptor 6 through the plurality of holes 240a provided on the shower plate 236a. The gas mixture fed onto the substrate 200 passes between the processing chamber side wall 203a and the external peripheral part of the baffle plate 205, and is then exhausted from the exhaust duct 231 via the exhaust vent 230. By feeding this gas mixture for a prescribed time, a thin film having a thickness ranging from several angstroms to several tens of angstroms (a layer ranging from several atoms to several tens of atoms thick) is first formed on the substrate 200. During this period, a prescribed temperature (film formation temperature) is maintained by the heater 207 while the substrate 200 is rotated, and a film that is uniform throughout the plane of the substrate 200 can thereby be formed.

After the source gas has been fed onto the substrate 200 for a prescribed period of time, the valve 243a provided in the source gas feeding duct 1a is closed, and feeding of source gas onto the substrate 200 is stopped. Preferably, the valve 243g provided in the source gas vent duct 1b is opened at this time so that the source gas is exhausted by the source gas vent duct 1b so as to bypass the processing chamber 203 without interrupting the supply of source gas from the vaporizer 255 (in other words, without interrupting the production of source gas in the vaporizer 255). A certain amount of time is required to achieve a stable supply of source gas by the vaporization of the liquid source material, but by allowing the flow to bypass the processing chamber 203 without interrupting the source gas from the vaporizer 255, it becomes possible to immediately feed the source gas to the substrate 200 by simply switching the flow during the subsequent source gas feeding step.

Purge Step

The gas inside the processing chamber 203 is purged by closing the valve 243a provided in the source gas feeding duct 1a (S6). Specifically, since the valve 243e remains open during the source gas feeding step, and the inert gas ($N_2$ or the like) is constantly being fed from the inert gas feeding duct 2a into the processing chamber 203, the inside of the processing chamber 203 is simultaneously purged by closing the valve 243a to stop the source gas from being fed to the substrate 200. The inert gas fed into the processing chamber 203 passes between the processing chamber side wall 203a and the external peripheral part of the baffle plate 205, and is then exhausted from the exhaust duct 231 via the exhaust vent 230. The residual gas inside the processing chamber 203 is thereby removed.

Activated Gas Feeding Step

After the purge step has been conducted for a prescribed period of time, the activated gas is fed into the processing chamber 203 as the second processing gas (S7).

More specifically, the valve 243c provided in the Ar gas feeding duct 3d is opened, the Ar gas as the plasma ignition gas is fed from the Ar gas feeding unit 250c to the activation mechanism 9 while the flow rate is controlled by the mass flow controller 241c, and an Ar plasma is produced through activation (plasma excitation) by the activation mechanism 9. The valve 243b provided in the reaction gas feeding duct 3a is then opened, and $O_2$ gas as the reaction gas (oxidizing agent) that is the basis for the activated gas as the second processing gas is fed from the reaction gas feeding unit 250b to the activation mechanism 9 while the flow rate is controlled by the mass flow controller 241b. The activation of the $O_2$ gas as the reaction gas is performed by the Ar plasma that has been produced by the activation mechanism 9, thus giving an activated gas that includes oxygen radicals. The valve 243f provided in the activated gas feeding duct 3c is then opened, the activated gas is fed from the activation mechanism 9 into the processing chamber 203, and the activated gas is fed via the shower head 236 onto the substrate 200. At this time, the valve 243h provided in the activated gas vent duct 3b is closed.

When ozone ($O_3$) is intended to be obtained as the activated gas, the valve 243b provided in the reaction gas feeding duct 3a is opened and the oxygen gas that is the reaction gas is fed from the reaction gas feeding unit 250b to the activation mechanism 9 while the flow rate is controlled by the mass flow controller 241b, giving ozone ($O_3$) as the activated gas. The valve 243f provided in the activated gas feeding duct 3c is then opened, ozone ($O_3$) is fed from the activation mechanism 9 into the processing chamber 203, and the ozone ($O_3$) is fed via the shower head 236 onto the substrate 200. The valve 243h provided in the activated gas vent duct 3b is kept closed at this time as well.

The activated gas fed onto the substrate 200 passes between the processing chamber side wall 203a and the external peripheral part of the baffle plate 205, and is then exhausted from the exhaust duct 231 via the exhaust vent 230.

While the activated gas is being fed into the processing chamber 203, the surface of the substrate 200 is kept at a prescribed temperature (for example, the same temperature as the film forming conditions for CVD) by the heater 207 while the substrate 200 is rotated. This makes it possible to rapidly and uniformly remove impurities such as carbon and hydrogen from the thin film having a thickness of several angstroms through several tens of angstroms (a layer of several atoms to several tens of atoms thick) that has been formed on the substrate 200 during the source gas feeding step.

After the activated gas has been fed onto the substrate 200 for a prescribed period of time, the valve 243f provided in the activated gas feeding duct 3c is closed and the supply of activated gas onto the substrate 200 is stopped. Preferably, the valve 243h provided in the activated gas vent duct 3b is opened at this time, so that the activated gas is exhausted through the activated gas vent duct 3b in a way that bypasses the processing chamber 203 without interrupting the supply of activated gas from the activation mechanism 9 (i.e., without interrupting the production of activated gas by the activation mechanism 9). A certain amount of time is required to achieve a stable supply through the production of activated gas containing oxygen radicals, for example, from reaction gas. When the flow is allowed to bypass the processing chamber 203 without interrupting the supply of activated gas from the activation mechanism 9, it is possible to supply the activated gas directly onto the substrate 200 by simply switching the flow during the next activated gas feeding step.

The source gas feeding step and the activated gas feeding step are preferably conducted at approximately the same temperature (specifically, a constant setting for the temperature of the heater 207, without change, is preferred). By avoiding temperature fluctuations, it becomes possible to suppress thermal expansion and thermal contraction of peripheral members such as the shower head 236, the susceptor 6, and the baffle plate 205 and to suppress the generation of particles (foreign matter) from the peripheral members. By not allowing temperature fluctuations, it becomes possible to suppress the release of metal (metal contamination) from the surface-treated (coated) metallic components in the structure of the substrate processing apparatus.

Purge Step

The inside of the processing chamber 203 is purged by closing the valve 243f provided in the activated gas feeding duct 3c (S8). Specifically, since the valve 243e is left open in the activated gas feeding step, and the inert gas ($N_2$ or the like) is constantly being fed from the inert gas feeding unit 250e into the processing chamber 203, the interior of the processing chamber 203 is simultaneously purged by closing the valve 243f and stopping the supply of activated gas to the substrate 200. The inert gas fed into the processing chamber 203 passes between the processing chamber side wall 203a and the external peripheral part of the baffle plate 205, and is exhausted through the exhaust duct 231 via the exhaust vent 230. The residual gas inside the processing chamber 203 is thereby removed.

After the inside of the processing chamber 203 has been purged for a prescribed period of time, the valve 243g provided in the source gas vent duct 1b is closed and the valve 243a provided in the source gas feeding duct 1a is opened, whereby the source gas is again fed onto the substrate 200 via the shower head 236 (S5). A thin film having a thickness of several angstroms to several tens of angstroms (a layer of several atoms to several tens of atoms thick) is again deposited on the thin film that has previously been formed by conducting the previously described series of operations, namely, the source gas feeding step, the purge step, the activated gas feeding step, and the purge step.

Thin Film Formation Step (Repetition Step)

Cyclic processing is performed in which a cycle comprising the source gas feeding step, the purge step, the activated gas feeding step, and the purge step as described above is repeated a multiple number of times (S9). A thin film having the desired film thickness with an extremely minimal admixture of impurities such as CH and OH can thereby be formed on the substrate 200.

Substrate Unloading Step

After a thin film of the desired thickness has been formed on the substrate 200, the rotation of the substrate 200 by the rotation mechanism 267 is stopped, and the sequence of steps from the substrate loading step to the pressure adjustment step described above is reversed, whereby the substrate 200 provided with the thin film having the desired thickness is removed from the processing chamber 203 (S10). The substrate processing step is thus completed.

(3) EXAMPLES

Following are descriptions of an example and comparative example relating to the first embodiment of the present invention with regard to the detailed sequence of the cyclic processing in which the cycle comprising the source gas feeding step, the purge step, the activated gas feeding step, and the purge step is repeated a multiple number of times.

Comparative Example

Figure 4:
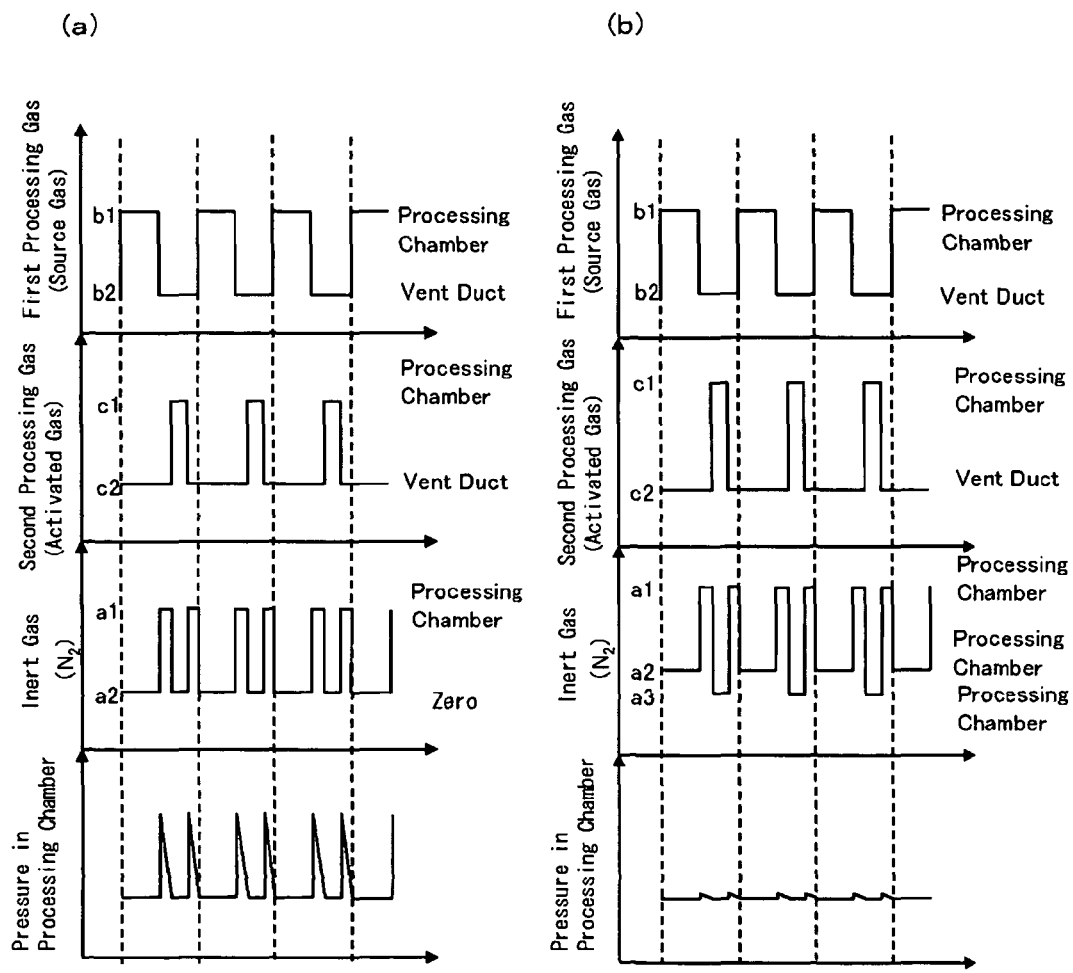

The explanation begins with a description of conventional cyclic processing as a comparative example, and then proceeds to explain the cyclic processing according to the first embodiment of the present invention. FIG. 4A is a view showing the detailed sequence of the comparative example, which is an example of conventional cyclic processing. As shown in FIG. 4A, in the conventional cyclic processing according to the comparative example, one cycle comprises: (1) feeding of source gas obtained by vaporizing MO source material (source gas feeding step), (2) feeding of inert gas ($N_2$ gas) (purge step), (3) feeding of activated gas ($O_2$/Ar mixed gas) obtained by activating an oxidizing agent ($O_2$) (activated gas feeding step), and (4) feeding of inert gas (purge step). This cycle is repeated a multiple number of times.

The present comparative example is executed by the substrate processing apparatus according to the first embodiment shown in FIG. 1 described above. Specifically, the source gas is fed from the source gas feeding duct 1a, the inert gas from the inert gas feeding duct 2a, and the reaction gas from the reaction gas feeding duct 3a. Nitrogen gas is used as a carrier gas during feeding of the source gas. The reaction gas is activated and converted to activated gas in the activation mechanism 9, and is fed from the activated gas feeding duct 3c.

In the present comparative example, the flow rate of the source gas fed from the source gas feeding duct 1a is always a constant value b1. By opening the valve 243a and closing the valve 243g, the flow rate of the source gas fed inside the processing chamber 203 during the source gas feeding step becomes the rate b1. When the valve 243a is closed and the valve 243g is opened, the source gas is exhausted via the source gas vent duct 1b, thus bypassing the processing chamber 203, and the flow rate of the source gas fed to the processing chamber 203 during the activated gas feeding step and purge step is therefore brought to b2 (=0). The flow rate b1 at which the source gas is supplied represents the total flow rate, including the carrier gas.

In the present comparative example, the flow rate of the activated gas fed from the activated gas feeding duct 3c is always constant at c1. Thus a flow rate of c1 is obtained for the supply of activated gas into the processing chamber 203 during the activated gas feeding step by opening the valve 243f and closing the valve 243h. A flow rate of c2 (=0) is obtained for the supply of activated gas into the processing chamber 203 during the source gas feeding step and the purge step by closing the valve 243f and opening the valve 243h, because the activated gas bypasses the processing chamber 203 and is exhausted by the activated gas vent duct 3b.

In the present comparative example, the flow rate of the inert gas fed from the inert gas feeding duct 2a is always constant at a1. A flow rate of a1 is thereby obtained for the supply of inert gas into the processing chamber 203 during the purge step by opening the valve 243e. A flow rate of a2 (=0) is obtained for the supply of inert gas into the processing chamber 203 during the source gas feeding step and the activated gas feeding step by closing the valve 243e.

In the description given above, to keep constant the total flow rate of the gas fed into the processing chamber 203, the mass flow controllers 241a through 241e are controlled so that b1 (the flow rate of source gas supply), c1 (the flow rate of activated gas supply), and a1 (the flow rate of inert gas supply) are equal (b1=c1=a1).

However, the pressure graph (representing the pressure inside the processing chamber) shown at the bottom of FIG. 4A shows that a pressure fluctuation occurs in the processing chamber 203 at the moment when the valve 243e is opened (in other words, at the starting point of the purge step between the source gas feeding step and the activated gas feeding step). According to the findings of the inventors, the pressure fluctuation produced in the processing chamber 203, causes the agitation of foreign matter within the processing chamber 203 as described above, which is a cause of foreign matter being adsorbed on the substrate 200.

The inventors therefore conducted a concentrated investigation of the cause of the pressure fluctuations within the processing chamber 203. As a result, the inventors learned that the pressure inside the inert gas feeding duct 2a upstream of the valve 243e increases, and a pressure difference occurs between the upstream side and the downstream side of the valve 243e when the valve 243e is closed in conjunction with completion of the purge step, and that the pressure difference in the inert gas feeding duct 2a is transmitted into the processing chamber 203 as a pulse when the valve 243e is opened in conjunction with restarting of the purge step, and pressure fluctuations thereby occur in the processing chamber 203. The inventors also learned that the pressure difference sometimes cannot be fully absorbed by the pressure control unit 7 when the speed of pressure fluctuation of the pressure difference transmitted as a pulse in the processing chamber 203 is higher than the response speed of the pressure control unit 7, or when the pressure difference transmitted into the processing chamber 203 is larger than the allowed adjustment range of the pressure control unit 7. The pressure inside the inert gas feeding duct 2a upstream of the valve 243e in a case in which the valve 243e is closed is considered to be about the same (on the order of $10^5$ Pa) as the secondary pressure of a regulator (not shown) of the inert gas feeding unit 250e. The pressure inside the inert gas feeding duct 2a downstream of the valve 243e when the valve 243e is closed is considered to be about the same (103 Pa or less) as the pressure inside the processing chamber 203. Specifically, when the valve 243e is closed, the pressure difference between the upstream side and the downstream side of the valve 243e in the inert gas feeding duct 2a is considered to be 102 Pa or greater.

Example

In contrast, as a result of concentrated investigation, the inventors discovered that even if a substrate processing apparatus having the structure shown in FIG. 1 is used, it is still possible to suppress pressure fluctuations from occurring within the processing chamber 203 if the supply of gases is controlled as in the example described below.

FIG. 4B is a detailed sequence chart showing an example of the cyclic processing according to the first embodiment, which is able to suppress pressure fluctuations from occurring within the processing chamber 203.

As shown in FIG. 4B, the cyclic processing of the present example has the following steps as one cycle: (1) feeding of a source obtained by activating an MO source material, and feeding of an inert gas ($N_2$ gas) (source gas feeding step); (2) feeding of an inert gas (purge step); (3) feeding of an activated gas ($O_2$/Ar mixed gas) obtained by activating an oxidizing agent ($O_2$), and feeding of an inert gas (activated gas feeding step); and (4) feeding of an inert gas (purge step), and this cycle is repeated a multiple number of times. Specifically, in the comparative example, feeding of inert gas from the inert gas feeding duct 2a into the processing chamber 203 was interrupted during the source gas feeding step and activated gas feeding step, but the present example differs from the comparative example in that inert gas is fed continuously, and without interruption, from the inert gas feeding duct 2a during the source gas feeding step and the activated gas feeding step. The present example also differs from the comparative example in that the flow rate of the fed inert gas is varied so as to achieve a constant total flow rate of the gas fed into the processing chamber 203 during the source gas feeding step, the activated gas feeding step, and the purge step.

The present example is also executed using the substrate processing apparatus of the first embodiment shown in FIG. 1 and described above. Specifically, the source gas is fed from the source gas supply duct 1a, the inert gas is fed from the inert gas feeding duct 2a, and the reaction gas is fed from the reaction gas feeding duct 3a. When the source gas is fed, $N_2$ gas is used as the carrier gas. The reaction gas is activated by the activation mechanism 9, and fed as activated gas from the activated gas feeding duct 3c.

In the present example, the flow rate of source gas from the source gas feeding duct 1a is always constant at b1, the same as in the comparative example. Thus, when the valve 243a is opened and the valve 243g is closed, the flow rate of the source gas fed into the processing chamber 203 during the source gas feeding step becomes b1. When the valve 243a is closed and the valve 243g is opened, the source gas bypasses the processing chamber 203 and is exhausted through the source gas vent duct 1b, and the flow rate of the source gas fed into the processing chamber 203 during the activated gas feeding step and purge step is therefore brought to b2 (=0). The flow rate b1 at which the source gas is supplied represents the total flow rate, including the carrier gas.

In the present example, the flow rate of the activated gas fed from the activated gas feeding duct 3c is always constant at c1, the same as in the comparative example. Therefore when the valve 243f is open and the valve 243h is closed, the flow rate of the activated gas fed to the processing chamber 203 during the activated gas feeding step is c1. When the valve 243f is closed and the valve 243h is opened, the activated gas bypasses the processing chamber 203 and is exhausted through the activated gas vent duct 3b, and the flow rate of the activated gas that is fed into the processing chamber 203 during the source gas feeding step and purge step is therefore brought to c2 (=0). FIG. 4B is a sequence diagram showing a case in which c1>b1.

In contrast, in the present example, the flow rate of inert gas from the inert gas feeding duct 2a differs from that of the comparative example. Specifically, the flow rate of inert gas is adjusted by the mass flow controller 241e to be a1 ($\neq$0) during the purge step, the flow rate of inert gas is adjusted to be a2 ($\neq$0) during the source gas feeding step, and the flow rate of inert gas is adjusted to be a3 ($\neq$0) during the activated gas feeding step. In other words, during the source gas feeding step and the activated gas feeding step, feeding of inert gas from the inert gas feeding duct 2a into the processing chamber 203 is continued without interruption, but the feeding rate of the inert gas is varied.

The sum (a2+b1) of the flow rate (a2) of inert gas fed during the source gas feeding step and of the flow rate (b1) of source gas fed during the same step, and the sum (a3+c1) of the flow rate of the inert gas fed during the activated gas feeding step and the flow rate (c1) of the activated gas fed during the same step, are controlled by mass flow controllers 241a through 241e, respectively, so as to satisfy the equation (a2+b1=a3+c1=a1).

Controlling the gas supply flow rates in this way makes it possible to suppress pressure fluctuations within the processing chamber 203, which in turn makes it possible to suppress the agitation of foreign matter within the processing chamber 203, and to suppress the adsorption of the foreign matter on the substrate 200.

In other words, in the present example inert gas is continuously fed from the inert gas feeding duct 2a into the processing chamber 203 during the source gas feeding step and the activated gas feeding step while the valve 243e provided in the inert gas feeding duct 2a is left open, without performing any opening or closing operations. This structure is considered to make it possible to suppress pressure fluctuations within the processing chamber 203 by eliminating pressure differences within the inert gas feeding duct 2a.

Fluctuations are also considered possible within the processing chamber 203, even for the present example, if a3 (the flow rate of inert gas during the activated gas feeding step) is equal to zero, and if the pressure difference that occurs within the inert gas feeding duct 2a, which accompanies the resumption of the purge step by the opening and closing of the valve 243e (when the inert gas supply flow rate changes from a3 (=0) to a1 ($\neq$0)), is transmitted to the processing chamber 203.

2. Second Embodiment of the Present Invention

The structure of the processing oven 202 of the substrate processing apparatus as the second embodiment of the present invention, and an example of the cyclic processing in the substrate processing step performed by the processing oven 202 will next be described in sequence.

(1) Structure of the Processing Oven

Figure 2:
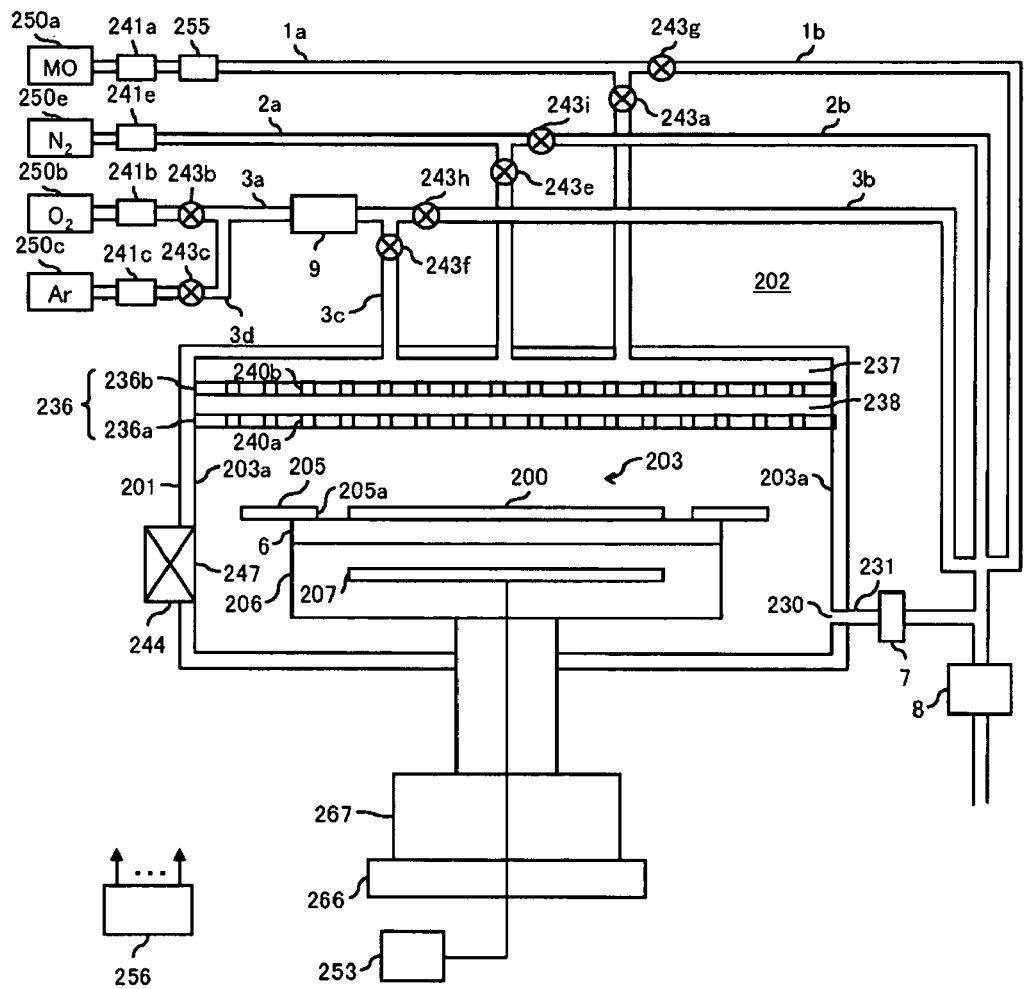
FIG. 2 is a schematic view showing the system structure of the processing oven of the substrate processing apparatus in the second embodiment of the present invention.

The structure of the processing oven of the substrate processing apparatus as the second embodiment of the present invention will first be described using FIG. 2. FIG. 2 is a schematic view showing an example of the processing oven of a single-wafer MOCVD device, which is the substrate processing apparatus according to the second embodiment of the present invention.

The processing oven 202 of the second embodiment differs from the processing oven 202 of the first embodiment in that an inert gas vent duct 2b is provided as an inert gas vent line not only to the source gas supply duct 1a and the activated gas feeding duct 3c, but also to the inert gas feeding duct 2a.

Specifically, as shown in FIG. 2, the inert gas vent duct 2b is provided on the upstream side (i.e., between the mass flow controller 241e and the valve 243e) of the valve 243e of the inert gas feeding duct 2a. The inert gas vent duct 2b is connected via a valve 243i between the exhaust gas pump 8 and the pressure controller 7 of the exhaust duct 231. In other respects the structure is the same as in the processing oven 202 of the first embodiment.

Venting lines (a source gas vent duct 1b and an activated gas vent duct 3b) are sometimes provided in the gas feeding ducts (a source gas feeding duct 1a and an activated gas feeding duct 3c) for reactive processing gases (source gas and activated gas) for which the gas supply flow rate must be precisely controlled. This is because adopting a structure whereby the destinations for each gas as fed from the side of the venting line into the processing chamber 203 can be switched by controlling the opening and closing of the valves makes it possible to realize a faster switching rate than if flow rate control mechanisms are installed on each of the gas feeding ducts (the source gas feeding duct 1a and the activated gas feeding duct 3c). Ordinarily, however, no venting line is provided on the inert gas feeding duct 2a. The main reasons for this are that, because the inert gas is not a reactive gas, the flow rate thereof does not contribute directly to the reaction system, and there is therefore no special need to precisely control the gas supply flow rate thereof; and that the cost of providing a separate inert gas vent line increases the overall cost of the substrate processing apparatus.

However, in the second embodiment, a structure is adopted in which an inert gas vent duct 2b is also provided in the inert gas feeding duct 2a, and pressure fluctuations within the processing chamber 203 can be suppressed by the rapid switching between destinations of the inert gas in accordance with the rapid switching between destinations of the processing gases (source gas and activated gas).

(2) Example of Cyclic Processing

Figure 5:
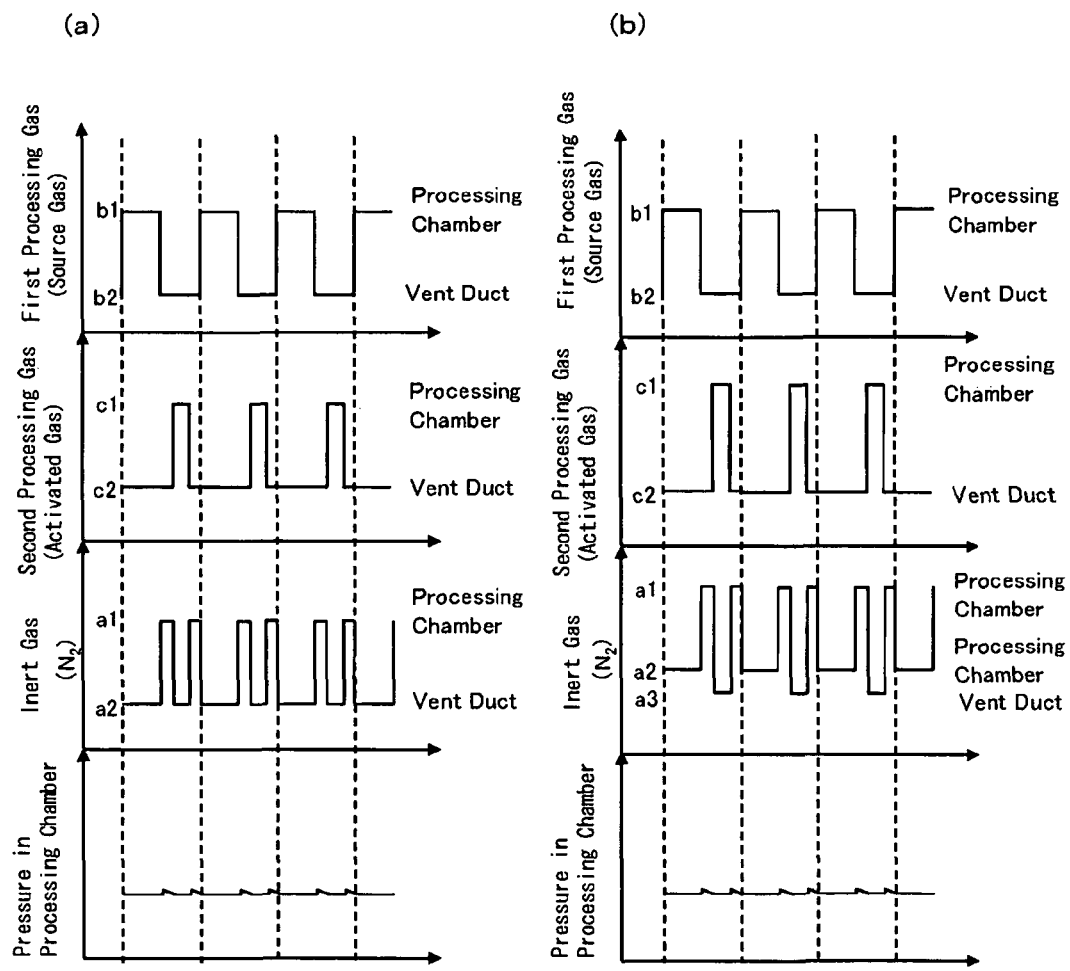

The substrate processing step according the second embodiment differs from the substrate processing step according to the first embodiment in terms of the cyclic processing that is executed as the substrate processing step. In other respects the substrate processing step is the same as the substrate processing step according to the first embodiment. Sequence example 1 and sequence example 2 for the example of the second embodiment will be described in sequence hereinafter using FIG. 5. FIGS. 5A and 5B show sequence example 1 and sequence example 2 of the example of the second embodiment.

The present example is executed by the substrate processing apparatus of the second embodiment shown in FIG. 2 and described above. More specifically, the source gas is fed from the source gas feeding duct 1a, the inert gas is fed from the inert gas feeding duct 2a, and the reaction gas is fed from the reaction gas feeding duct 3a. Nitrogen gas is used as a carrier gas when the source gas is fed. The reaction gas is first activated by the activation mechanism 9 and is then fed as activated gas from the activated gas feeding duct 3c.

Sequence Example 1

The sequence example 1 shown in FIG. 5A includes, as a single cycle, feeding a source gas as a first processing gas and an activated gas as a second processing gas into the processing chamber 203, and feeding $N_2$ as an inert gas to purge the inside of the processing chamber 203, and this cycle is repeated a multiple number of times.

More specifically, one cycle comprises a step of feeding the source gas as a first processing gas into the processing chamber 203; a step of purging the inside of the processing chamber 203 by feeding $N_2$ as the inert gas from the inert gas feeding duct 2a into the processing chamber 203; a step of feeding the activated gas as a second processing gas into the processing chamber 203; and a step of purging the inside of the processing chamber 203 by feeding $N_2$ as the inert gas from the inert gas feeding duct 2a into the processing chamber 203. This cycle is repeated a multiple number of times.

In the step of feeding the source gas and the step of feeding the activated gas, the valve 243e is closed and the valve 243i is opened, whereby the $N_2$ being fed in the inert gas feeding duct 2a is exhausted through the inert gas vent duct 2b without being fed into the processing chamber 203.

In the step of purging the inside of the processing chamber 203, the valve 243e is opened and the valve 243i is closed, whereby the flow of $N_2$ fed into the inert gas feeding duct 2a is redirected away from flowing into the inert gas vent duct 2b and towards flowing into the processing chamber 203. This makes it possible to keep the total flow rate of the gas entering the processing chamber 203 at a constant rate.

In sequence example 1, the flow rate of the source gas that is fed from the source gas feeding duct 1a is always constant at the rate b1. Therefore, when the valve 243a is opened and the valve 243g is closed, the flow rate of the source gas fed to the processing chamber 203 during the source gas feeding step is b1. When the valve 243a is closed and the valve 243g is opened, the source gas bypasses the processing chamber 203 and is exhausted through the source gas vent duct 1b, and the flow rate of the source gas fed into the processing chamber 203 during the activated gas feeding step and the purge step is therefore brought to b2 (=0). The flow rate b1 at which the source gas is supplied represents the total flow rate, including the carrier gas.

In sequence example 1, the flow rate of the activated gas fed from the activated gas feeding duct 3c is always the constant value c1. Therefore, by opening the valve 243f and closing the valve 243h, the flow rate of the activated gas fed to the processing chamber 203 during the activated gas feeding step is kept constant at c1. When the valve 243f is closed and the valve 243h is opened, the activated gas bypasses the processing chamber 203 and is exhausted by the activated gas vent duct 3b, and the flow rate of the activated gas fed into the processing chamber 203 during the source gas feeding step and purge step is therefore brought to c2 (=0).

In sequence example 1, the flow rate of the inert gas fed from the inert gas feeding duct 2a is always the constant value a1. During the purge step, the valve 243e is opened and the valve 243i is closed, whereby the flow of inert gas fed into the inert gas feeding duct 2a is redirected away from flowing into the inert gas vent duct 2b and towards flowing into the processing chamber 203. The flow rate of the inert gas fed to the processing chamber 203 is therefore a1. During the source gas feeding step and the activated gas feeding step, the valve 243e is closed and the valve 243i is opened, and the inert gas fed to the inert gas feeding duct 2a is thereby exhausted from the inert gas vent duct 2b without entering the processing chamber 203. The flow rate of the inert gas fed to the processing chamber 203 during the source gas feeding step and the activated gas feeding step is thereby brought to a2 (=0).

The flow rate of the source gas fed during the source gas feeding step (b1), the flow rate of the activated gas fed during the activated gas feeding step (c1), and the flow rate of the inert gas fed during the purge step (a1) are controlled by mass flow controllers 241a through 241e so as to satisfy the equation (b1=c1=a1), i.e., so that the total gas flow rate is kept constant within the processing chamber 203.

Controlling the gas supply flow rate in this manner makes it possible to suppress pressure fluctuations in the processing chamber 203, which in turn makes it possible to prevent foreign matter from being agitated within the processing chamber 203 and prevent the foreign matter from being adsorbed on the substrate 200.

More specifically, according to sequence example 1, during the source gas feeding step and the activated gas feeding step, the valve 243e provided in the inert gas feeding duct 2a is closed at the same time that the valve 243i provided in the inert gas vent duct 2b is opened, and inert gas is thereby always flowing through the inert gas feeding duct 2a. According to the findings of the inventors, the pressure difference that occurs within the inert gas feeding duct 2a is much less if inert gas is always flowing through the inert gas feeding duct 2a, even when the valve 243e is closed, than if no provision had been made for an inert gas vent duct 2b (as in the comparative example). Because the pressure difference propagated into the processing chamber 203 is slight, even when the valve 243e is again opened, it is thought that this pressure difference is absorbed inside the processing chamber 203, thus making it possible to suppress pressure fluctuations within the processing chamber 203.

When the valve 243e is closed and the valve 243i is opened, the pressure within the inert gas feeding duct 2a downstream of the valve 243e is thought to be on the same order ($10^3$ Pa or less) as the pressure within the processing chamber 203. It is also thought that the pressure within the inert gas feeding duct 2a upstream of the valve 243e is on the same order ($10^3$ Pa or less) as the pressure within the processing chamber 203. These hypotheses are posited because, assuming this situation, the portion of the inert gas feeding duct 2a that is downstream from the valve 243e, and the portion that is upstream from the valve 243e are exhausted to a vacuum in the same manner by the same exhaust pump 8. But because the gas expulsion routes from the valve 243e to the exhaust gas pump 8 are different in each case (because the flow resistance of each gas expulsion route is different), it is thought that a slight pressure difference on the order of less than 10 Pa occurs between the portions of the inert gas feeding duct 2a upstream and downstream from the valve 243e.

As described above, when no provision is made for an inert gas vent duct 2b (as in the comparative example), the closure of the valve 243e is thought to produce a twofold or greater (for example 100 Pa or greater) pressure difference in the processing pressure within the inert gas feeding duct 2a between the parts upstream and downstream of the valve 243e. In contrast, in sequence example 1, the valve 243e is closed and the valve 243i is opened, and it is believed that the pressure difference within the inert gas feeding duct 2a between the parts upstream and downstream of the valve 243e can thereby be controlled to less than ⅕ of the processing pressure (for example, 10 Pa or less). More specifically, in sequence example 1 the pressure difference between the parts upstream and downstream of the valve 243e within the inert gas feeding duct 2a can be reduced to one-tenth or less of what would be the case if no provision were made for an inert gas vent duct 2b (as in the comparative example), and this degree of reduction is sufficient to suppress pressure fluctuations within the processing chamber 203. The case of sequence example 1 also accommodates high-speed gas switching, which makes it possible to control the total flow rate resulting from the flow rates of all the gases that are fed, and thus in turn to suppress pressure fluctuations.

Sequence Example 2

The sequence example 2 shown in FIG. 5B includes, as a single cycle, a step of feeding a source gas as a first processing gas and feeding an activated gas as a second processing gas into the processing chamber 203, and a step of purging the inside of the processing chamber 203 by feeding $N_2$ as an inert gas, and this cycle is repeated a multiple number of times.

Specifically, sequence example 2 includes the following steps as one cycle: a step of feeding source gas as the first processing gas into the processing chamber 203; a step of purging the inside of the processing chamber 203 by feeding $N_2$ as an inert gas into the processing chamber 203 from the inert gas feeding duct 2a; a step of feeding activated gas as the second processing gas into the processing chamber 203; and a step of purging the inside of the processing chamber 203 by feeding $N_2$ as an inert gas into the processing chamber 203 from the inert gas feeding duct 2a, and this cycle is repeated a multiple number of times.

The step of feeding source gas and the step of feeding activated gas are conducted with the valve 243e closed and the valve 243i open, whereby the $N_2$ fed into the inert gas feeding duct 2a can be exhausted via the inert gas vent duct 2b without being fed into the processing chamber 203, or the flow rate of $N_2$ flowing into the processing chamber 203 from the inert gas feeding duct 2a can be made less than in the step of purging the inside of the processing chamber 203.

The step of purging the inside of the processing chamber 203 is conducted with the valve 243e open and the valve 243i closed, whereby the flow of $N_2$ fed to inert gas feeding duct 2a can be redirected from flowing into the inert gas vent duct 2b towards flowing into the processing chamber 203, or the flow rate of $N_2$ flowing into the processing chamber 203 from the inert gas feeding duct 2a can be made greater than in the step of feeding source gas or the step of feeding activated gas.

More specifically, in the step of feeding source gas as the first processing gas, the flow rate of $N_2$ flowing into the processing chamber 203 from the inert gas feeding duct 2a is less than in the step of purging the inside of the processing chamber 203. In the step of feeding activated gas as a second processing gas, the valve 243e is closed and the valve 243i is open, and the $N_2$ fed to the inert gas feeding duct 2a is thereby exhausted from the inert gas vent duct 2b without entering the processing chamber 203.

In the step of purging the inside of the processing chamber 203 after the step of feeding source gas, the flow rate of $N_2$ that flows into the processing chamber 203 from the inert gas feeding duct 2a is greater than in the step of feeding source gas. In the step of purging the inside of the processing chamber 203 after the step of feeding activated gas, the valve 243e is opened and the valve 243i is closed, and the flow of $N_2$ that is fed to the inert gas feeding duct 2a is thereby redirected from flowing into inert gas vent duct 2b towards flowing into the processing chamber 203. At this time, the total gas flow rate within the processing chamber 203 is constant.

In sequence example 2, the flow rate of the source gas fed from the source gas feeding duct 1a is always constant at b1. Therefore, the flow rate of the source gas entering the processing chamber 203 when the valve 243a is opened and the valve 243g is closed during the source gas feeding step is b1. Closing the valve 243a and opening the valve 243g cause the source gas to be exhausted from the source gas vent duct 1b while bypassing the processing chamber 203, and the flow rate of the source gas entering the processing chamber 203 is therefore kept at b2 (=0) during the activated gas feeding step and the purge step. The flow rate b1 at which the source gas is supplied represents the total flow rate, including the carrier gas.

In sequence example 2, the flow rate of the activated gas fed from the activated gas feeding duct 3c is always constant at c1. Therefore, the flow rate of the activated gas entering the processing chamber 203 during the activated gas feeding step is c1 when the valve 243f is open and the valve 243h is closed. When the valve 243f is closed and the valve 243h is opened, the activated gas bypasses the processing chamber 203 and is exhausted through the activated gas vent duct 3b, and the flow rate of the activated gas fed to the processing chamber 203 during the source gas feeding step and the purge step is therefore brought to c2 (=0). The flow rate of source gas and the flow rate of the activated gas fed to the processing chamber 203 during the steps of sequence example 2 are thus the same as in sequence example 1. But sequence example 2 differs from sequence example 1 in that c1 is larger than b1. In other words, in sequence example 2 the flow rate c1 of the activated gas fed from the activated gas feeding duct 3c is controlled by the mass flow controllers 241a through 241c so as to be greater the flow rate b1 at which the source gas is fed from source gas feeding duct 1a (c1>b1).

Sequence example 2 also differs from sequence example 1 with regard to the flow rate of inert gas from the inert gas feeding duct 2a.

First, during the purge step that follows the source gas feeding step, the valve 243e stays open and the valve 243i stays closed, and the mass flow controller 241e (*2) is controlled so that the flow rate of the inert gas flowing from inert gas feeding duct 2a into the processing chamber 203 is greater than the flow rate of inert gas during the source gas feeding step. During the purge step that follows the activated gas feeding step, the valve 243e is open and the valve 243i is closed, the same as in sequence example 1, and the flow of inert gas fed to the inert gas feeding duct 2a is therefore redirected away from flowing into the inert gas vent duct 2b and towards flowing into the processing chamber 203. During both the purge steps, the flow rate of the inert gas entering the processing chamber 203 is a1.

The mass flow controller 241e is adjusted so that the flow rate a2 at which the inert gas is supplied during the source gas feeding step (≠0) is less than the flow rate a1 at which the inert gas is supplied during the purge step (a2<a1).

During the activated gas feeding step, the valve 243e is closed and the valve 243i is opened, the same as in sequence example 1, whereby the inert gas is caused to bypass the processing chamber 203 and to be exhausted from the inert gas vent duct 2b, and the flow rate of the inert gas fed to the processing chamber 203 to be brought to a3 (=0).

The mass flow controllers 241a through 241e are controlled so that the equation (a2+b1=c1=a1) is satisfied, wherein the sum of the flow rate b1 of source gas and the flow rate a2 of inert gas fed during the source gas feeding step; the flow rate c1 of the activated gas fed during the activated gas feeding step; and the flow rate a1 of inert gas fed during the purge step are equal to each other, i.e., the individual flow rates are controlled so that the total flow rate of the gas entering the processing chamber 203 is kept constant.

Controlling the gas supply flow rates in this way makes it possible to suppress pressure fluctuations within the processing chamber 203, which in turn makes it possible to suppress the agitation of foreign matter within the processing chamber 203, and to suppress the adsorption of the foreign matter on the substrate 200.

Specifically, the method of the first embodiment described above (FIG. 4B) is used when a transfer is made from the source gas feeding step to the purge step, and the method of sequence example 1 in the example according to the second embodiment described above (FIG. 5A) is used when a transfer is made from the activated gas feeding step to the purge step. It is also possible in this way to suppress the occurrence of pressure fluctuations within the processing chamber 203 for the reasons described above. It is also possible to obtain the same effect by applying the method illustrated in FIG. 5A during the transfer from the source gas feeding step to the purge step, and to apply the method illustrated in FIG. 4B during the transfer from the activated gas feeding step to the purge step.

3. Third Embodiment of the Present Invention

The structure of the processing oven 202 of the substrate processing apparatus as the third embodiment of the present invention, and an example of the cyclic processing in the substrate processing step performed by the processing oven 202 will next be described in sequence.

(1) Structure of the Processing Oven

Figure 3:
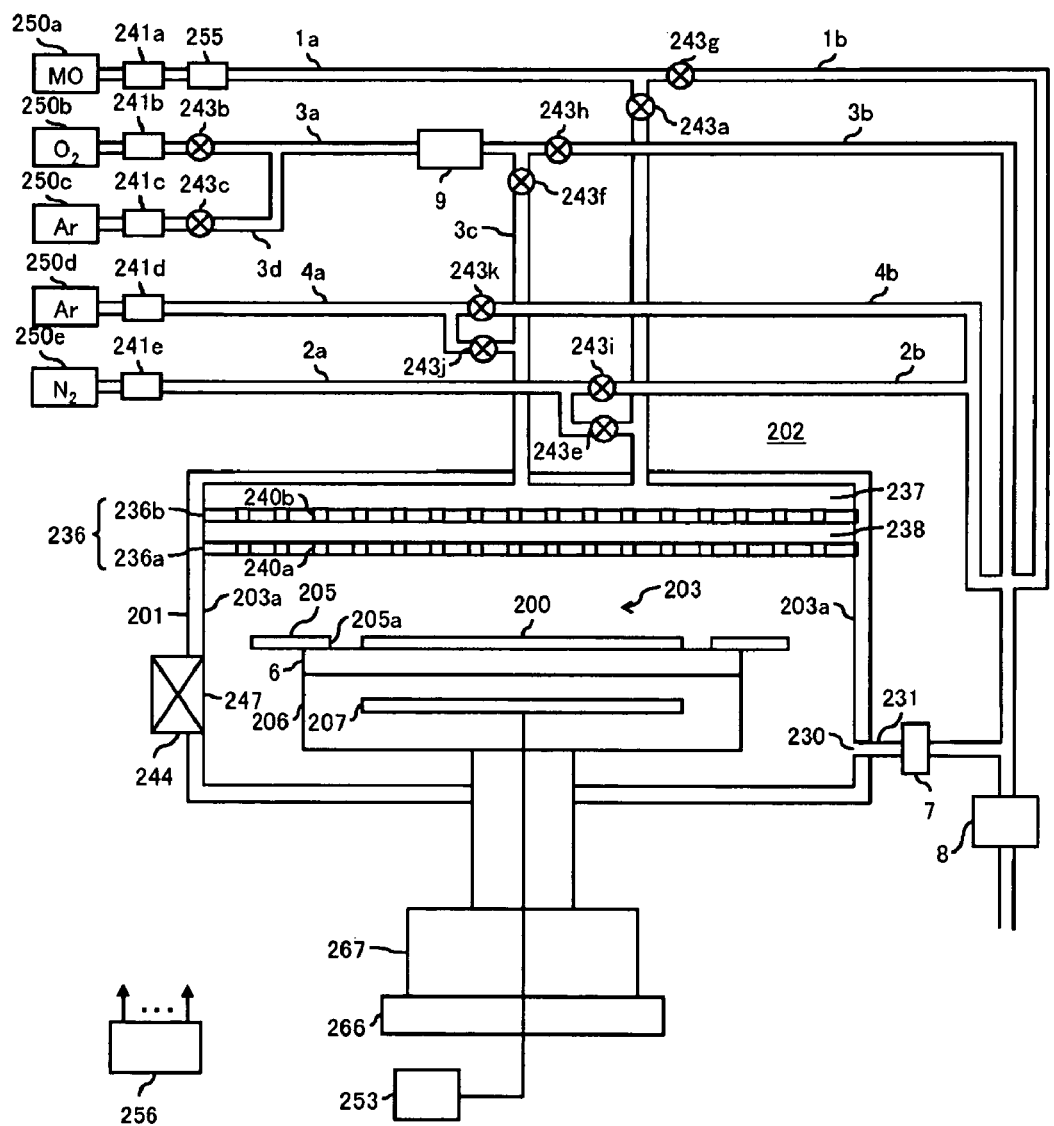
FIG. 3 is a schematic view showing the system structure of the processing oven of the substrate processing apparatus in the third embodiment of the present invention.

The structure of the processing oven of the substrate processing apparatus as the third embodiment of the present invention will first be described using FIG. 3. FIG. 3 is a schematic view showing an example of the processing oven of a single-wafer MOCVD device, which is the substrate processing apparatus according to the third embodiment of the present invention.

The processing oven 202 according to the third embodiment differs from the processing oven 202 of the second embodiment in that a second inert gas feeding duct 4a as an inert gas feeding line (second inert gas feeding line) that feeds Ar is furthermore provided in the third embodiment besides the first inert gas feeding duct 2a as an inert gas feeding line (first inert gas feeding line) that feeds $N_2$. The inert gas fed from the second inert gas feeding duct 4a is not limited to Ar, and may be $N_2$ or He.

An Ar-feeding second inert gas feeding unit 250d, a mass flow controller 241d as a flow rate control unit, and a valve 243j that controls the feeding of Ar are serially connected to the second inert gas feeding duct 4a. The second inert gas feeding duct 4a is not directly connected to the shower head 236, but is integrally connected so as to merge with the activated gas feeding duct 3c (downstream of the valve 243f) on the downstream side of the valve 243j.

A second inert gas vent duct 4b as a second inert gas venting line is provided on the upstream side (i.e., between the valve 243j and the mass flow controller 241d) of the valve 243j of the second inert gas feeding duct 4a. The second inert gas vent duct 4b is connected between the exhaust pump 8 and the pressure control unit 7 of the exhaust duct 231 via a valve 243k.

The processing oven 202 according to the third embodiment also differs from the processing oven 202 of the second embodiment in that the first inert gas feeding duct 2a that feeds $N_2$ is not directly connected to the shower head 236 in the third embodiment, but is integrally connected so as to merge with the source gas supply duct 1a (downstream of the valve 243a) on the downstream side of the valve 243e.

Other structural aspects are the same as in the first embodiment.

(2) Example of Cyclic Processing

Figure 6:
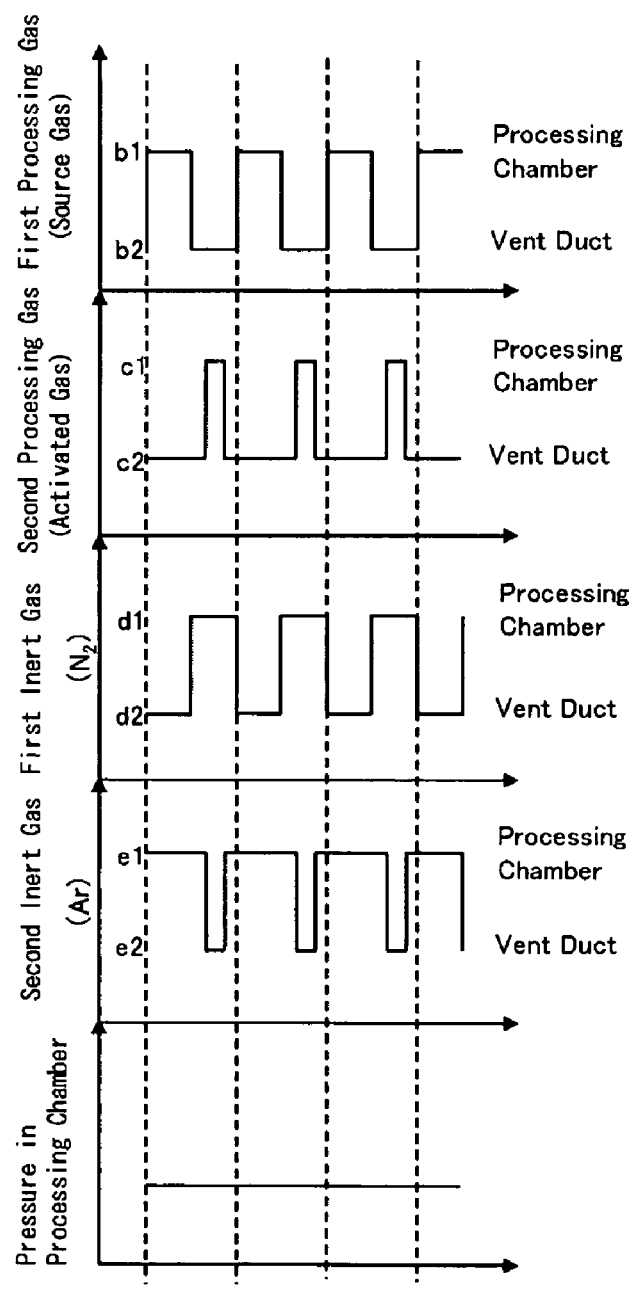
FIG. 6 shows an example of the sequence in the third embodiment of the present invention.

The substrate processing step according to the third embodiment differs from the substrate processing step according to first and second embodiments in terms of the cyclic processing executed as the substrate processing step. In other respects the substrate processing step is the same as the substrate processing step according to the first and second embodiments. A sequence example according to the third embodiment will be described hereinafter using FIG. 6. FIG. 6 shows a sequence example according to the third embodiment.

The present example is executed by the substrate processing apparatus of the third embodiment shown in FIG. 3 and described above. Specifically, the source gas is fed from the source gas feeding duct 1a, inert gas ($N_2$) is fed from the inert gas feeding duct 2a, the reaction gas is fed from the reaction gas feeding duct 3a, and inert gas (Ar) is fed from the second inert gas feeding duct 4a. Nitrogen gas is used as a carrier gas when the source gas is fed. The reaction gas is activated by the activation mechanism 9 and fed as activated gas from the activated gas feeding duct 3c.

Specifically, the sequence example shown in FIG. 6 includes, as a single cycle, feeding a source gas as a first processing gas and an activated gas as a second processing gas into the processing chamber 203, and feeding $N_2$ or Ar as an inert gas to purge the inside of the processing chamber 203, and this cycle is repeated a multiple number of times.

Specifically, one cycle includes: feeding source gas as a first processing gas into the processing chamber 203; purging the inside of the processing chamber 203 by feeding $N_2$ and Ar as inert gases through the first inert gas feeding duct 2a and the second inert gas feeding duct 4a into the processing chamber 203; feeding activated gas as a second processing gas into the processing chamber 203; and purging the inside of the processing chamber 203 by feeding $N_2$ and Ar as inert gases through the first inert gas feeding duct 2a and the second inert gas feeding duct 4a into the processing chamber 203. This cycle is repeated a multiple number of times.

In the step of feeding the source gas, the valve 243e is closed and the valve 243i is opened, whereby the $N_2$ being fed into the first inert gas feeding duct 2a the inert gas vent duct 2b without being fed into the processing chamber 203. The valve 243k is also closed and the valve 243j is opened, whereby the Ar fed in the second inert gas feeding duct 4a is fed into the processing chamber 203.

In the step of feeding the activated gas, the valve 243j is closed and the valve 243k is opened, whereby the Ar being fed in the second inert gas feeding duct 4a is exhausted through the second inert gas vent duct 4b without being fed into the processing chamber 203. The valve 243i is also closed and the valve 243e is opened, whereby the $N_2$ fed in the first inert gas feeding duct 2a is fed into the processing chamber 203.

In the step of purging the inside of the processing chamber 203 after the step of feeding the source gas, the valve 243i is closed and the valve 243e is opened in a state in which the valve 243k is left closed and the valve 243j is left open, and in which the flow of Ar into the processing chamber 203 from the second inert gas feeding duct 4a is maintained. The flow of $N_2$ fed into the first inert gas feeding duct 2a is thereby redirected towards the processing chamber 203 from flowing into the inert gas vent duct 2b.

In the step of purging the inside of the processing chamber 203 after the step of feeding the activated gas, the valve 243k is left closed and the valve 243j is left open in a state in which the valve 243i is left closed and the valve 243e is left open, and in which the flow of $N_2$ into the processing chamber 203 from the first inert gas feeding duct 2a is maintained. The flow of Ar fed into the second inert gas feeding duct 4a is thereby redirected towards the processing chamber 203 from flowing into the second inert gas vent duct 4b. At this time, the total gas flow rate of the gas fed into the processing chamber 203 is kept constant.

In the present example, the flow rate of source gas from the source gas feeding duct 1a is always kept constant at the rate b1. Therefore, when the valve 243a is opened and the valve 243g is closed, the flow rate of the source gas fed to the processing chamber 203 during the source gas feeding step is b1. When the valve 243a is closed and the valve 243g is opened, the source gas bypasses the processing chamber 203, and is exhausted through the source gas vent duct 1b, and the flow rate of the source gas fed into the processing chamber 203 during the activated gas feeding step and the purge step is therefore brought to b2 (=0). The flow rate b1 at which the source gas is supplied represents the total flow rate, including the carrier gas.

In the present example, the flow rate of activated gas from the activated gas feeding duct 3c is always the constant value c1. Therefore, by opening the valve 243f and closing the valve 243h, the flow rate of the activated gas fed to the processing chamber 203 during the activated gas feeding step is brought to c1. When the valve 243f is closed and the valve 243h is opened, the activated gas bypasses the processing chamber 203 and is exhausted through the activated gas vent duct 3b, and the flow rate of the activated gas fed into the processing chamber 203 during the source gas feeding step and purge step is therefore brought to c2 (=0).

In the present example, the flow rate of the inert gas ($N_2$) from the first inert gas feeding duct 2a is always the constant value d1. During the purge step and the activated gas feeding step, the valve 243e is opened and the valve 243i is closed, whereby the flow rate of the inert gas ($N_2$) fed into the processing chamber 203 via the source gas supply duct 1a is brought to d1. During the source gas feeding step, the valve 243e is closed and the valve 243i is opened, whereby the flow rate of the inert gas ($N_2$) fed into the processing chamber 203 via the source gas supply duct 1a is brought to d2 (=0).

In the present example, the flow rate of the inert gas (Ar) from the second inert gas feeding duct 4a is always the constant value e1. During the purge step and the source gas feeding step, the valve 243j is opened and the valve 243k is closed, whereby the flow rate of the inert gas (Ar) fed into the processing chamber 203 via the activated gas feeding duct 3c is brought to e1. During the activated gas feeding step, the valve 243j is closed and the valve 243k is opened, whereby the flow rate of the inert gas (Ar) fed into the processing chamber 203 via the activated gas feeding duct 3c is brought to e2 (=0).

The mass flow controllers 241a through 241e are controlled so that the sum (e1+b1) of the flow rate (b1) of the source gas and the flow rate (e1) of inert gas (Ar) in the source gas feeding step, the sum (d1+c1) of the flow rate (c1) of the activated gas and the flow rate (d1) of the inert gas ($N_2$) in the activated gas feeding step, and the sum (d1+e1) of the flow rate (e1) of the inert gas (Ar) and the flow rate (d1) of the inert gas ($N_2$) in the purge step satisfy the following equation: e1+b1=d1+c1=d1+e1.

Controlling the gas supply flow rate in this manner makes it possible to suppress pressure fluctuations in the processing chamber 203, which in turn makes it possible to prevent foreign matter from being agitated within the processing chamber 203 and prevent the foreign matter from being adsorbed on the substrate 200.

Specifically, according to the present example, the valve 243i provided in the first inert gas vent duct 2b is opened at the same time that the valve 243e provided in the first inert gas feeding duct 2a is closed, and inert gas ($N_2$) is thereby always flowing through the inert gas feeding duct 2a. In the same manner, the valve 243k provided in the second inert gas vent duct 4b is opened at the same time that the valve 243j provided in the second inert gas feeding duct 4a is closed, and inert gas (Ar) is thereby always flowing through the inert gas feeding duct 4a. According to the findings of the inventors, the pressure difference that occurs within the first inert gas feeding duct 2a and the second inert gas feeding duct 4a is much less if inert gas ($N_2$, Ar) is always flowing through the first inert gas feeding duct 2a and the second inert gas feeding duct 4a, even when the valve 243e and the valve 243j are closed, than if no provision is made for the first inert gas vent duct 2b and the second inert gas vent duct 4b. Because the pressure difference propagated into the processing chamber 203 is slight even when the valves 243e and 243j are opened, it is thought that this pressure difference is absorbed inside the processing chamber 203, thus making it possible to suppress pressure fluctuations within the processing chamber 203.

The pressure within the inert gas feeding duct 2a downstream of the valve 243e when the valve 243e is closed and the valve 243i is opened is thought to be about the same ($10^3$ Pa or less) as the pressure within the processing chamber 203. It is also thought that the pressure within the inert gas feeding duct 2a upstream of the valve 243e is about the same ($10^3$ Pa or less) as the pressure within the processing chamber 203. These hypotheses are posited because, assuming this situation, the portion of the first inert gas feeding duct 2a that is downstream from the valve 243e, and the portion that is upstream from the valve 243e are exhausted to a vacuum in the same manner by the same exhaust pump 8. But because the gas expulsion routes from the valve 243e to the exhaust gas pump 8 are different in each case, it is thought that a slight pressure difference on the order of less than 10 Pa occurs between the portions of the inert gas feeding duct 2a upstream and downstream from the valve 243e. In the same manner, the pressure within the second inert gas feeding duct 4a downstream of the valve 243j when the valve 243j is closed and the valve 243k is opened is thought to be about the same ($10^3$ Pa or less) as the pressure within the processing chamber 203. It is also thought that the pressure within the second inert gas feeding duct 4a upstream of the valve 243j is about the same ($10^3$ Pa or less) as the pressure within the processing chamber 203. These hypotheses are posited because, assuming this situation, the portion of the second inert gas feeding duct 4a that is downstream from the valve 243j, and the portion that is upstream from the valve 243j are exhausted to a vacuum in the same manner by the same exhaust pump 8. But because the gas expulsion routes from the valve 243j to the exhaust gas pump 8 are different in each case (i.e., each expulsion route has a different fluid resistance), it is thought that a slight pressure difference on the order of less than 10 Pa can occur between the portions of the second inert gas feeding duct 4a upstream and downstream from the valve 243j. In the case of the present example, the total flow rate of gas feeding can be controlled, and the occurrence of pressure fluctuations can be suppressed to allow faster rerouting of gases.

According to the present example, the inside of the source gas supply duct 1a can be constantly purged by $N_2$ when the source gas is not being fed, and the inside of the activated gas feeding duct 3c can be constantly purged by Ar when the activated gas is not being fed. The third embodiment (the structure shown in FIG. 6) can be considered to be preferable to the second embodiment (the structure shown in FIG. 5) by virtue of having such duct purging effects through the use of inert gas.

In the example (FIG. 4B) of the first embodiment, the valve 243e provided in the inert gas feeding duct 2a is not closed, but is left always open, and the inert gas is fed in the form of a pulse into the processing chamber 203 by increasing the flow rate of inert gas through the use of the mass flow controller 241e. In contrast, in sequence example 1 (FIG. 5A) of the second embodiment, the inert gas is fed in the form of a pulse into the processing chamber 203 by switching the opening and closing of the valves 243e, 243i and switching the flow of inert gas, rather than increasing the flow rate of the inert gas through the use of the mass flow controller 241e. In the third embodiment, the inert gas is fed in the form of a pulse into the processing chamber 203 by switching the opening and closing of the valves 243e, 243i and the valves 243j, 243k and switching the flow of the inert gas, rather than by increasing the flow rate of the inert gas through the use of the mass flow controllers 241e, 241d. As a result, the rate at which the inert gas is fed can be more rapidly increased (the responsiveness of gas flow control can be enhanced), as shown in FIG. 8B.

Figure 8:
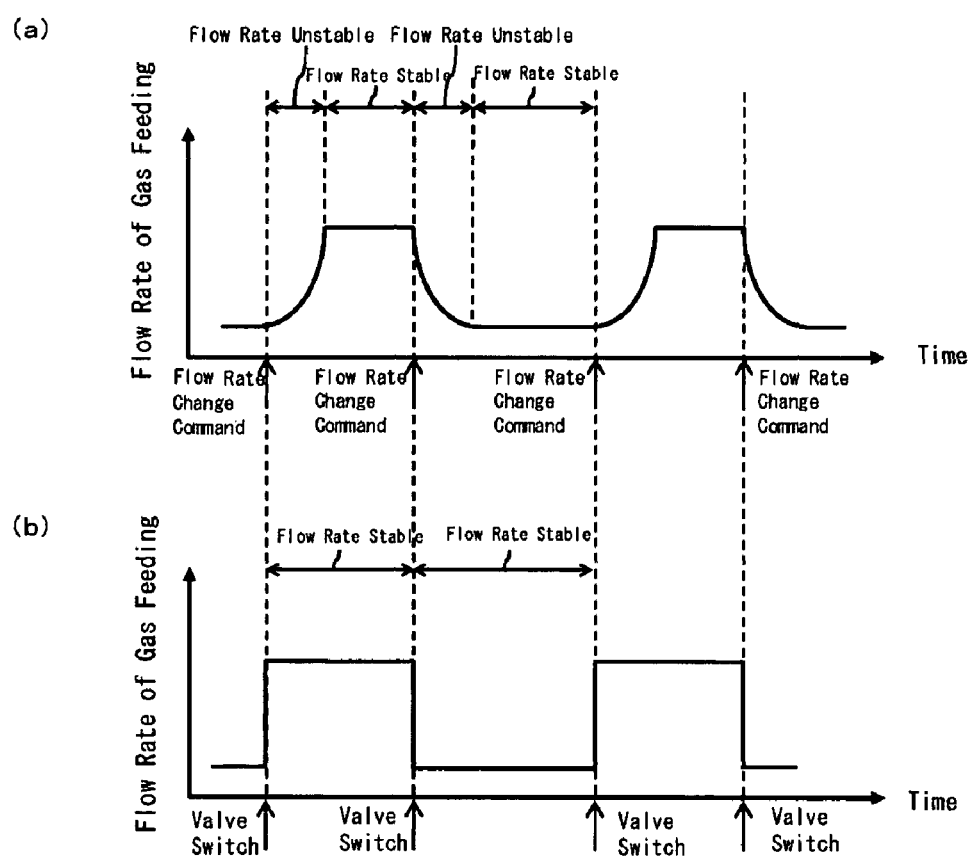
FIG. 8A is a graph showing an example of the change in flow rate of the inert gas when the flow rate is increased and decreased by the mass flow controller.
FIG. 8B is a graph showing an example of the change in flow rate of the inert gas when the flow is switched by opening and closing of a valve.

FIG. 8A is a graph showing an example of the variation in the flow rate of the inert gas when the flow rate is increased by a mass flow controller, and FIG. 8B is a graph showing an example of the variation in the flow rate of inert gas when the flow is switched by switching between the opening and closing of a valve. In both of the graphs, the vertical axis indicates the flow rate of the inert gas that is fed as a pulse into the processing chamber 203, and the horizontal axis indicates the elapsed time. According to FIG. 8, when the flow of inert gas is switched by switching between the opening and closing of a valve (FIG. 8B), the time (response time of flow rate control) from the start of the flow rate increase until stabilization of the flow rate is shorter, and the flow rate can be increased more rapidly in comparison to the case of increasing the flow rate by a mass flow controller (FIG. 8A). When the flow rate is increased by a mass flow controller (FIG. 8A), time is required for the flow rate to stabilize after a flow rate change command is issued, and the responsiveness of the rise and fall of the flow rate change is poor. However, when the flow of inert gas is switched by switching between the opening and closing of a valve (FIG. 8B), only a short time is taken from switching between the opening and closing of the valve until the flow rate stabilizes, and the responsiveness of the rise and fall of the flow rate change is good.

4. Fourth Embodiment of the Present Invention

The structure of the processing oven 202 of the substrate processing apparatus as the fourth embodiment of the present invention, and an example of the cyclic processing in the substrate processing step performed by the processing oven 202 will next be described in sequence.

(1) Structure of the Processing Oven

Figure 9:
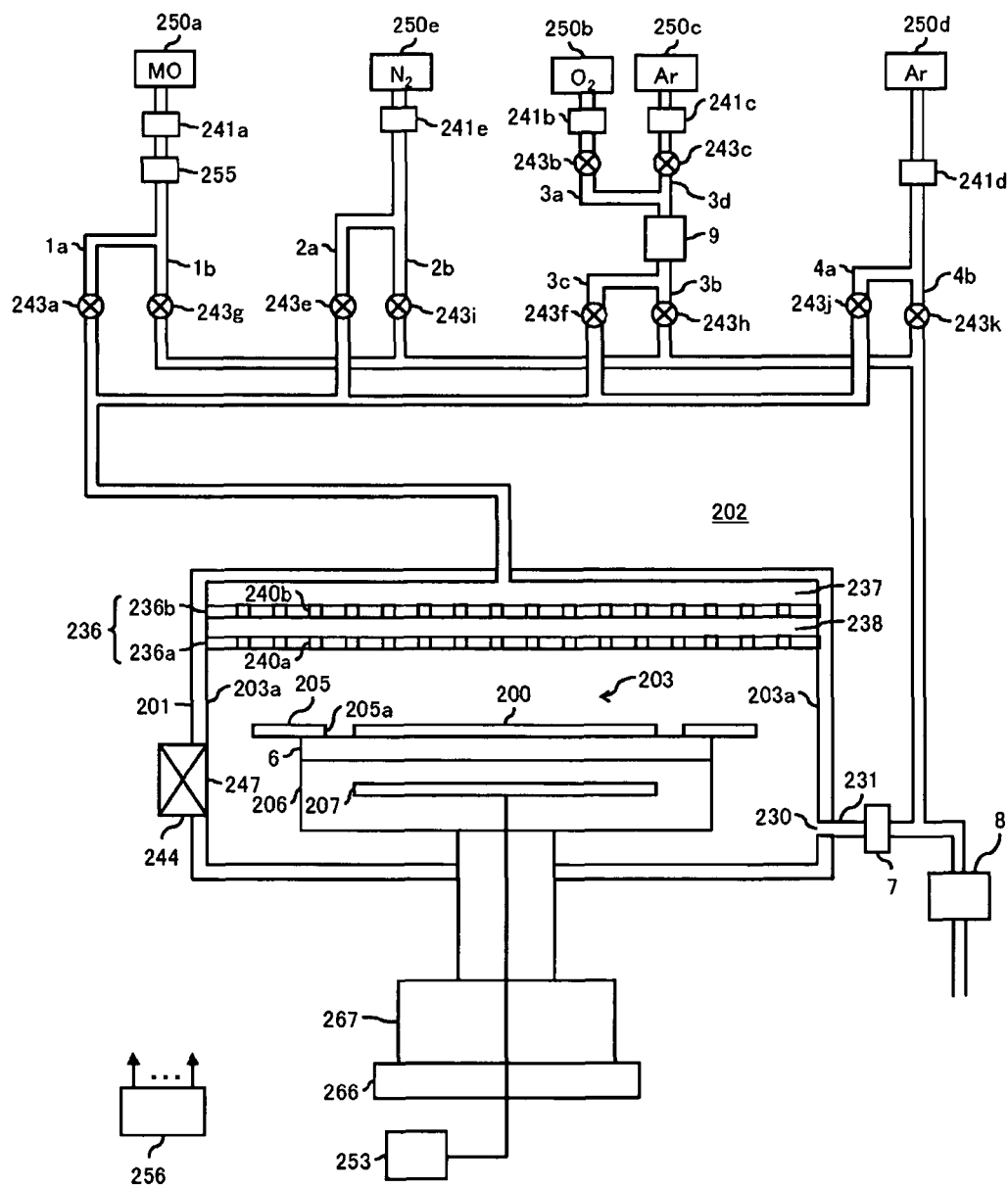
FIG. 9 is a schematic view showing the system structure of the processing oven of the substrate processing apparatus in the fourth embodiment of the present invention.

The structure of the processing oven 202 of the substrate processing apparatus as the fourth embodiment of the present invention will first be described using FIG. 9. FIG. 9 is a schematic view showing an example of the processing oven of a single-wafer MOCVD device, which is the substrate processing apparatus according to the fourth embodiment of the present invention.

The processing oven 202 in the fourth embodiment differs from the processing oven 202 of the third embodiment in that the source gas supply duct 1a, the first inert gas feeding duct 2a, the activated gas feeding duct 3c, and the second inert gas feeding duct 4a are integrally connected to the shower head 236 so as to merge downstream of the valves 243a, 243e, 243f, 243j, respectively. The source gas vent duct 1b, the first inert gas vent duct 2b, the activated gas vent duct 3b, and the second inert gas vent duct 4b are connected between the exhaust pump 8 and the pressure control unit 7 of the exhaust duct 231 via valves 243g, 243i, 243h, 243k, in the same manner as in the third embodiment.

Other structural aspects are the same as in the third embodiment.

(2) Example of Cyclic Processing

The substrate processing step according to the fourth embodiment differs from the substrate processing step according to the third embodiment in that the flow rate controllers and valves are controlled so that the flow rate (load on the exhaust pump 8) of the gas exhausted by the exhaust pump 8 in the cycle step (S9) is always constant.

Specifically, the operations of the mass flow controllers 241a through 241e and the valves 243a through 243k are controlled so that the total flow rate of the flow rate (flow rate of the gas exhausted via the processing chamber 203) of the gas exhausted through the exhaust duct 231 (exhaust vent 230) during feeding of the processing gas into the processing chamber 203 and the flow rate (flow rate of the gas exhausted through the vent ducts without passing through the processing chamber 203) of the gas exhausted through the source gas vent duct 1b, the first inert gas vent duct 2b, the activated gas vent duct 3b, and the second inert gas vent duct 4b is kept constant; and so that the total flow rate of the flow rate (flow rate of the gas exhausted via the processing chamber 203) of the gas exhausted through the exhaust duct 231 (exhaust vent 230) during feeding of the activated gas into the processing chamber 203, and the flow rate (flow rate of the gas exhausted through the vent ducts without passing through the processing chamber 203) of the gas exhausted through the source gas vent duct 1b, the first inert gas vent duct 2b, the activated gas vent duct 3b, and the second inert gas vent duct 4b is also kept constant.

An example of the flow rates of the various gases in the cyclic processing of the present embodiment will be described using FIG. 10.

First, in the source gas feeding step (S5), the valves 243a, 243i, 243h, 243j are opened and the valves 243g, 243e, 243f, 243k are closed while the flow rates are controlled by the mass flow controllers 241a through 241e. The flow rate of the source gas fed into the processing chamber 203 from the source gas supply duct 1a and exhausted from the exhaust vent 230 is thereby set to 0.5 slm, the flow rate of the inert gas (Ar) fed into the processing chamber 203 from the second inert gas feeding duct 4a and exhausted from the exhaust vent 230 is set to 0.2 slm, the flow rate of the inert gas ($N_2$) exhausted from the first inert gas vent duct 2b without passing through the processing chamber 203 is set to 0.5 slm, and the flow rate of the activated gas exhausted through the activated gas vent duct 3b without passing through the processing chamber 203 is set to 0.2 slm.

In the purge step (S6) according to the present embodiment, the valves 243g, 243e, 243h, 243j are opened and the valves 243a, 243i, 243f, 243k are closed while the flow rates are controlled by the mass flow controllers 241a through 241e. The flow rate of the inert gas ($N_2$) fed into the processing chamber 203 from the first inert gas feeding duct 2a and exhausted from the exhaust vent 230 is thereby set to 0.5 μm, the flow rate of the inert gas (Ar) fed into the processing chamber 203 from the second inert gas feeding duct 4a and exhausted from the exhaust vent 230 is set to 0.2 μm, the flow rate of the source gas exhausted through the source gas vent duct 1b without passing through the processing chamber 203 is set to 0.5 slm, and the flow rate of the activated gas exhausted through the activated gas vent duct 3b without passing through the processing chamber 203 is set to 0.2 slm.

In the activated gas feeding step (S7) according to the present embodiment, the valves 243g, 243e, 243f, 243k are opened and the valves 243a, 243i, 243h, 243j are closed while the flow rates are controlled by the mass flow controllers 241a through 241e. The flow rate of the inert gas ($N_2$) fed into the processing chamber 203 from the first inert gas feeding duct 2a and exhausted from the exhaust vent 230 is thereby set to 0.5 slm, the flow rate of the activated gas fed into the processing chamber 203 from the reaction gas feeding duct 3a and exhausted from the exhaust vent 230 is set to 0.2 slm, the flow rate of the source gas exhausted through the source gas vent duct 1b without passing through the processing chamber 203 is set to 0.5 slm, and the flow rate of the inert gas (Ar) exhausted from the second inert gas vent duct 4b without passing through the processing chamber 203 is set to 0.2 slm.

In the purge feeding step (S8) according to the present embodiment, the valves 243g, 243e, 243h, 243j are opened and the valves 243a, 243i, 243f, 243k are closed while the flow rates are controlled by the mass flow controllers 241a through 241e. The flow rate of the inert gas ($N_2$) fed into the processing chamber 203 from the first inert gas feeding duct 2a and exhausted from the exhaust vent 230 is thereby set to 0.5 slm, the flow rate of the inert gas (Ar) fed into the processing chamber 203 from the second inert gas feeding duct 4a and exhausted from the exhaust vent 230 is set to 0.2 slm, the flow rate of the source gas exhausted through the source gas vent duct 1b without passing through the processing chamber 203 is set to 0.5 slm, and the flow rate of the activated gas exhausted through the activated gas vent duct 3b without passing through the processing chamber 203 is set to 0.2 slm.

In the steps from the source gas feeding step (S5) to the purge feeding step (S8) in the present embodiment, the subtotal flow rate of the gas fed into the processing chamber 203 and exhausted from the exhaust vent 230 is always 0.7 slm (=0.5 slm+0.2 slm), the subtotal flow rate of the gas exhausted through the vent ducts without passing through the processing chamber 203 is always 0.7 slm (=0.5 slm+0.2 slm), and the total flow rate of the gas exhausted by the exhaust pump 8 is always 1.4 slm (=0.7 slm+0.7 slm). Specifically, the flow rate (load of the exhaust pump 8) of the gas exhausted by the exhaust pump 8 is always constant. In the steps from the source gas feeding step (S5) to the purge feeding step (S8), there is always a constant (1:1) ratio between the subtotal flow rate (0.7 slm) of the gas fed into the processing chamber 203 and exhausted from the exhaust vent 230, and the subtotal flow rate (0.7 slm) of the gas exhausted through the vent ducts without passing through the processing chamber 203. Controlling the gas supply flow rate in this manner makes it possible to suppress pressure fluctuations in the processing chamber 203, which in turn makes it possible to prevent foreign matter from being agitated within the processing chamber 203 and prevent the foreign matter from being adsorbed on the substrate 200.

5. Fifth Embodiment of the Present Invention

In the present embodiment, an assembly of a processing gas feeding line, a processing gas vent line, an inert gas feeding line, and an inert gas vent line is provided for each type of processing gas that is fed into the processing chamber 203. The lines are configured so as to operate in cooperation with each other in the step of feeding the processing gas into the processing chamber 203, and in the step of purging the inside of the processing chamber 203.

Figure 11:
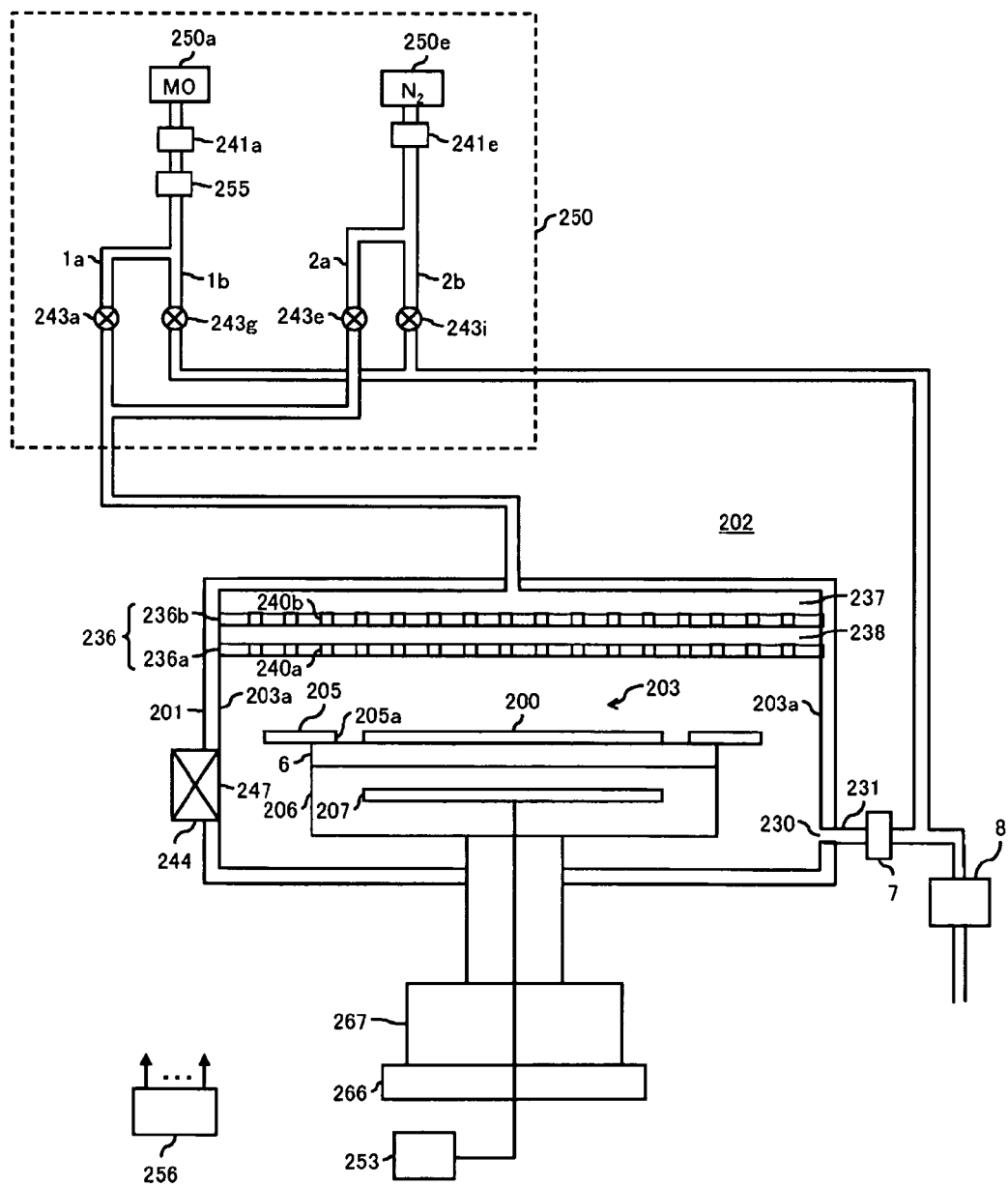
FIG. 11 is a schematic view showing the system structure of the processing oven of the substrate processing apparatus in the fifth embodiment of the present invention.

The structure of the processing oven 202 of the substrate processing apparatus as the fifth embodiment of the present invention will first be described using FIG. 11. FIG. 11 is a schematic view showing an example of the processing oven 202 of a single-wafer MOCVD device, which is the substrate processing apparatus according to the fifth embodiment of the present invention.

As shown in FIG. 11, the source gas supply duct 1a, the first inert gas feeding duct 2a, the source gas vent duct 1b, and the first inert gas vent duct constitute an assembly 250. An assembly 250 is provided for each type of processing gas fed into the processing chamber 203. For example, when an activated gas is fed as the processing gas into the processing chamber 203, an assembly (not shown) is provided that includes an activated gas feeding duct, a second inert gas feeding duct, an activated gas vent duct, and a second inert gas vent duct. Other structural aspects are the same as in the third embodiment.

An example of the flow rates of the various gases in the cyclic processing of the present embodiment will be described using FIG. 12.

As shown in FIG. 12, in the source gas feeding step (S5) of the present embodiment, the valves 243a, 243i are opened and the valves 243g, 243e are closed while the flow rate is controlled by the mass flow controllers 241a, 241e. The flow rate of the source gas fed into the processing chamber 203 from the source gas supply duct 1a and exhausted from the exhaust vent 230 is thereby set to 0.5 slm, and the flow rate of the inert gas ($N_2$) exhausted from the first inert gas vent duct 2b without passing through the processing chamber 203 is set to 0.5 slm.

As shown in FIG. 12, in the purge step (S6) of the present embodiment, the valves 243g, 243e are opened and the valves 243a, 243i are closed while the flow rate is controlled by the mass flow controllers 241a, 241e. The flow rate of the inert gas ($N_2$) fed into the processing chamber 203 from the first inert gas feeding duct 2a and exhausted from the exhaust vent 230 is thereby set to 0.5 slm, and the flow rate of the source gas exhausted through the source gas vent duct 1b without passing through the processing chamber 203 is set to 0.5 slm.

In the source gas feeding step (S5) and the purge step (S6) in the present embodiment, the subtotal flow rate of the gas fed into the processing chamber 203 and exhausted from the exhaust vent 230 is always 0.5 slm, the subtotal flow rate of the gas exhausted through the vent ducts without passing through the processing chamber 203 is always 0.5 slm, and the total flow rate of the gas exhausted by the exhaust pump 8 is always 1.0 slm. Specifically, the flow rate (load of the exhaust pump 8) of the gas exhausted by the exhaust pump 8 is always constant. In the source gas feeding step (S5) and the purge step (S6), there is always a constant (1:1) ratio between the subtotal flow rate (0.5 slm) of the gas fed into the processing chamber 203 and exhausted from the exhaust vent 230, and the subtotal flow rate (0.5 slm) of the gas exhausted through the vent ducts without passing through the processing chamber 203. Controlling the gas supply flow rate in this manner makes it possible to suppress pressure fluctuations in the processing chamber 203, which in turn makes it possible to prevent foreign matter from being agitated within the processing chamber 203 and prevent the foreign matter from being adsorbed on the substrate 200.

6. Sixth Embodiment of the Present Invention

In the present embodiment, the ratio between the subtotal flow rate of the gas fed into the processing chamber 203 and exhausted from the exhaust vent 230, and the subtotal flow rate of the gas exhausted through the vent ducts without passing through the processing chamber 203 is not 1:1, but is always constant in the source gas feeding step (S5) and the purge step (S6).

Figure 13:
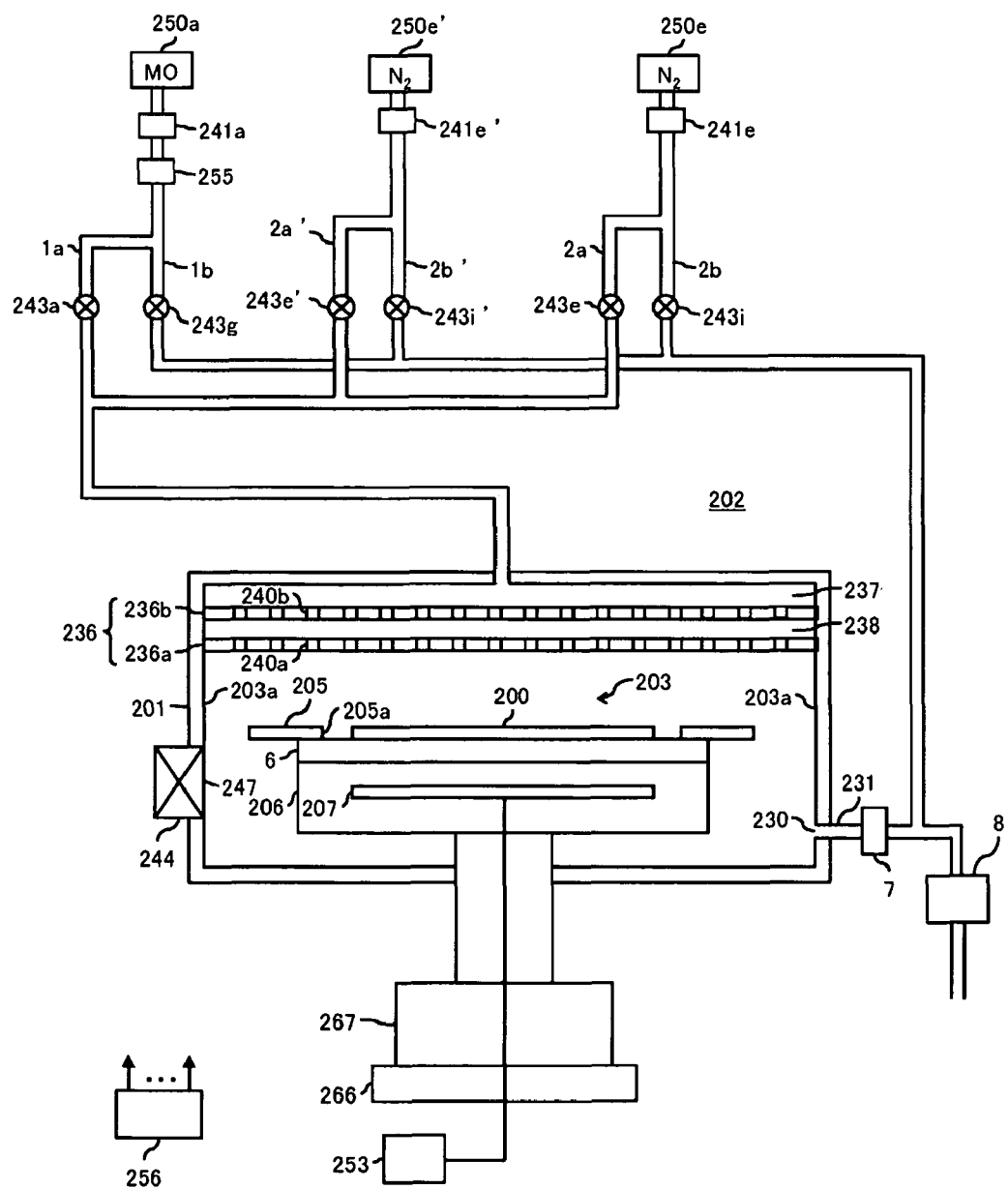
FIG. 13 is a schematic view showing the system structure of the processing oven of the substrate processing apparatus in the sixth embodiment of the present invention.

The structure of the processing oven of the substrate processing apparatus as the sixth embodiment of the present invention will be described using FIG. 13. FIG. 13 is a schematic view showing an example of the processing oven of a single-wafer MOCVD device, which is the substrate processing apparatus according to the sixth embodiment of the present invention.

As shown in FIG. 13, a dilution inert gas feeding duct 2a' as an inert gas feeding line for diluting the source gas, and a dilution inert gas vent (bypass) duct 2b, as a dilution inert gas vent line are provided in addition to the source gas supply duct 1a, the first inert gas feeding duct 2a, the source gas vent duct 1b, and the first inert gas vent duct.

An inert gas feeding unit 250e' that feeds the diluting inert gas as a non-reactive gas, and a mass flow controller 241e' as a flow rate control unit (flow rate controller) that controls the flow rate of inert gas are provided in the dilution inert gas feeding duct 2a' in sequence from the upstream side. The inert gas use is $N_2$, for example. The dilution inert gas feeding duct 2a' is integrally connected so as to merge with the source gas supply duct 1a (downstream of the valve 243a) and the first inert gas feeding duct 2a (downstream of the valve 243e) via a valve 243e'.

The dilution inert gas vent duct 2b' is provided on the upstream side (i.e., between the valve 243e' and the mass flow controller 241e') of the valve 243e' of the dilution inert gas feeding duct 2a'. The dilution inert gas vent duct 2b' is connected between the exhaust pump 8 and the pressure control unit 7 of the exhaust duct 231 via a valve 243i'.

Other structural aspects are the same as in the fifth embodiment.

An example of the flow rates of the various gases in the cyclic processing of the present embodiment will be described using FIG. 14.

In the source gas feeding step (S5) of the present embodiment, the valves 243a, 243e', 243i are opened and the valves 243g, 243i', 243e are closed while the flow rate is controlled by the mass flow controllers 241a, 241e, 241e'. The flow rate of the source gas fed into the processing chamber 203 from the source gas supply duct 1a and exhausted from the exhaust vent 230 is thereby set to 0.5 slm, the flow rate of the inert gas ($N_2$) fed into the processing chamber 203 from the dilution inert gas feeding duct 2a' and exhausted from the exhaust vent 230 is set to 0.2 slm, and the flow rate of the inert gas ($N_2$) exhausted from the first inert gas vent duct 2b without passing through the processing chamber 203 is set to 0.5 slm.

In the purge step (S6) of the present embodiment, the valves 243g, 243e', 243e are opened and the valves 243a, 243i', 243i are closed while the flow rate is controlled by the mass flow controllers 241a, 241e, 241e'. The flow rate of the inert gas ($N_2$) fed into the processing chamber 203 from the first inert gas feeding duct 2a and exhausted from the exhaust vent 230 is thereby set to 0.5 slm, the flow rate of the inert gas ($N_2$) fed into the processing chamber 203 from the dilution inert gas feeding duct 2a, and exhausted from the exhaust vent 230 is set to 0.2 slm, and the flow rate of the source gas exhausted through the source gas vent duct 1b without passing through the processing chamber 203 is set to 0.5 slm.

In the source gas feeding step (S5) and the purge step (S6) in the present embodiment, the subtotal flow rate of the gas fed into the processing chamber 203 and exhausted from the exhaust vent 230 is always 0.7 slm, the subtotal flow rate of the gas exhausted through the vent ducts without passing through the processing chamber 203 is always 0.5 slm, and the total flow rate of the gas exhausted by the exhaust pump 8 is always 1.2 slm. Specifically, the flow rate (load of the exhaust pump 8) of the gas exhausted by the exhaust pump 8 is always constant. In the source gas feeding step (S5) and the purge step (S6), there is always a constant (7:5) ratio between the subtotal flow rate (0.7 slm) of the gas fed into the processing chamber 203 and exhausted from the exhaust vent 230, and the subtotal flow rate (0.5 slm) of the gas exhausted through the vent ducts without passing through the processing chamber 203. Controlling the gas supply flow rate in this manner makes it possible to suppress pressure fluctuations in the processing chamber 203, which in turn makes it possible to prevent foreign matter from being agitated within the processing chamber 203 and prevent the foreign matter from being adsorbed on the substrate 200.

The following processing conditions are used when an $HfO_2$ film is formed on the substrate 200, for example, using the sequences described in the examples of the first through sixth embodiments described above. Processing temperature: 350 to 450° C.; processing pressure: 50 to 200 Pa; organic liquid source material (MO source material) forming the basis of the source gas as the first processing gas: $Hf(MMP)_4$ ($Hf[OC(CH_3)_2CH_2OCH_3]_4$ (tetrakis(1-methoxy-2-methyl-2-propoxy)hafnium)); feed rate of the organic liquid source material (MO source material): 0.01 to 0.2 g/min; reactive gas (oxidizing agent) forming the basis of the activated gas as the second processing gas: $O_2$/Ar gas mixture; $O_2$ feed rate: 200 to 2000 sccm; Ar feed rate: 0 to 1800 sccm.

Other Embodiments of the Present Invention

Besides the film formation described in the embodiments above, the present invention can be widely applied to cases in which film formation is advanced by switching the feeding of two or more types of source materials. Examples include Ru, $RuO_2$ film formation through alternate feeding of a Ru source material such as $Ru(EtCp)_2$ or another and an oxidizing agent such as $O_2$ activated by a remote plasma unit, and HfSiO film formation through alternate feeding of a Hf source material such as $Hf-(MMP)_4$, a Si source material such as $Si-(MMP)_4$, and an oxidizing agent such as $H_2O$ or $O_3$.

An example was also described in which the film formation step by source material feeding, and a modification (impurity removal) step by feeding of an active oxidizing species were repeated, but the present invention is not limited by this structure, and can also be applied to a case in which there is a need for ALD or another more periodic process in which source material feeding and feeding of oxidizing agents and other reaction gases is repeated. Ozone or another oxidizing species that does not use a remote plasma unit may also be used as the oxidizing agent. In this case, an ozonizer may be used as the activation mechanism 9, as previously described. Suppressing pressure fluctuations may be used in the same manner when two or more source materials necessary for film formation are combined, and the combination of source material and oxidizing agent is not limiting.

A CVD process was described as an example in the above-mentioned embodiments, but because pressure fluctuation also occurs during gas switching in an ALD process, the use of the present method may produce effects whereby pressure fluctuation is suppressed. In this case, the shower head that is the gas mixing part may also be substituted with a simple structure, and it is also possible not to use a shower head.

The gases used in the present invention are not limited to the previously mentioned gases, and may be appropriately selected from various types of gases according to a purpose of use. For example, the source gas is not limited to gases that include Ru, Hf, and Si, and a gas that includes Al, Ti, Sr, Y, Zr, Nb, Sn, Ba, La, Ta, Ir, Pt, W, Pb, Bi, or the like may also be used. Besides O radicals, $H_2O$ gas, and $O_3$ gas, NO, $N_2O$, $H_2O_2$, $N_2$, $NH_3$, $N_2H_6$, or gases containing radical species and ion species thereof that are generated by activating these gases through the use of an activation unit may be used as the reaction gas.

In the description given above, a case was described in which the present invention was applied to a MOCVD method for alternately repeating the feeding of source gas and the feeding of reaction gas, but the present invention may also be applied to an MOCVD method in which the source gas and the reaction gas are simultaneously fed.

Preferred Aspects of the Present Invention

According to an aspect of the present invention, there is provided a substrate processing apparatus including:

a processing chamber for processing a substrate;

a processing gas feeding line for feeding a processing gas into the processing chamber;

an inert gas feeding line for feeding an inert gas into the processing chamber;

an inert gas vent line provided in the inert gas feeding line, for exhausting the inert gas fed into the inert gas feeding line without feeding the inert gas into the processing chamber;

a first valve provided in the inert gas feeding line, on a downstream side of a part where the inert gas vent line is provided in the inert gas feeding line;

a second valve provided in the inert gas vent line; and an exhaust line that exhausts an inside of the processing chamber.

The substrate processing apparatus preferably includes a controller that controls the valves so that:

the inert gas fed into the inert gas feeding line is exhausted in advance from the inert gas vent line when the inert gas is not fed into the processing chamber through the inert gas feeding line; and a flow of the inert gas fed into the inert gas feeding line can be switched from the flow toward the inert gas vent line to the flow toward the inside of the processing chamber when the inert gas is fed into the processing chamber through the inert gas feeding line.

The substrate processing apparatus preferably includes a processing gas vent line provided in the processing gas feeding line, for exhausting the processing gas fed into the processing gas feeding line without feeding the processing gas into the processing chamber;

a third valve provided in the processing gas feeding line, on a downstream side of a part where the processing gas vent line is provided in the processing gas feeding line;

a fourth valve provided in the processing gas vent line; and a controller that controls the valves so that the processing gas and the inert gas are alternately fed into the processing chamber, the inert gas fed into the inert gas feeding line is exhausted through the inert gas vent line without being fed into the processing chamber when the processing gas is exhausted through the exhaust line while being fed into the processing chamber through the processing gas feeding line, and the processing gas fed into the processing gas feeding line is exhausted through the processing gas vent line without being fed into the processing chamber when the inert gas is exhausted through the exhaust line while being fed into the processing chamber through the inert gas feeding line.

In a preferred structure of the substrate processing apparatus, a flow rate controller is provided in each of the processing gas feeding line and the inert gas feeding line; and the controllers are furthermore control the flow rate controllers so as to make constant:

a total flow rate of a flow rate of the gas exhausted through the exhaust line and a flow rate of the gas exhausted through the inert gas vent line when the processing gas is fed into the processing chamber; and a total flow rate of a flow rate of the gas exhausted through the processing gas vent line and a flow rate of the gas exhausted through the exhaust line when the inert gas is fed into the processing chamber; and so as to make constant:

a ratio between a flow rate of the gas exhausted through the inert gas vent line and a flow rate of the gas exhausted through the exhaust line when the processing gas is fed into the processing chamber; and a ratio between a flow rate of the gas exhausted through the processing gas vent line and a flow rate of the gas exhausted through the exhaust line when the inert gas is fed into the processing chamber.

In a preferred structure of the substrate processing apparatus, a flow rate controller is provided in each of the first processing gas feeding line, the second processing gas feeding line, and the inert gas feeding line, and the controller furthermore controls the flow rate controllers so that a total gas flow rate of the gas fed into the processing chamber is kept constant when the processing gas and the inert gas are alternately fed into the processing chamber.

According to another aspect of the present invention, there is provided a substrate processing apparatus including:

a processing chamber for processing a substrate;

a processing gas feeding line for feeding a processing gas into said processing chamber;

an inert gas feeding line for feeding an inert gas into said processing chamber;

an inert gas vent line provided in said inert gas feeding line, for exhausting said inert gas fed into said inert gas feeding line without feeding said inert gas into the processing chamber;

a first valve provided in said inert gas feeding line, on a downstream side of a part where said inert gas vent line is provided in said inert gas feeding line;

a second valve provided in the inert gas vent line; and an exhaust line that exhausts an inside of said processing chamber.

The substrate processing apparatus preferably includes:

a first processing gas vent line provided in the first processing gas feeding line, for exhausting the first processing gas fed into the first processing gas feeding line without feeding the first processing gas into the processing chamber;

a second processing gas vent line provided in the second processing gas feeding line, for exhausting the second processing gas fed into the second processing gas feeding line without feeding the second processing gas into the processing chamber;

a third valve provided in the first processing gas feeding line, on a downstream side of a part where the first processing gas vent line is provided in the first processing gas feeding line;

a fourth valve provided in the first processing gas vent line;

a fifth valve provided in the second processing gas feeding line, on a downstream side of a part where the second processing gas vent line is provided in the second processing gas feeding line;

a sixth valve provided in the second processing gas vent line; and a controller that controls the valves so that:

the first processing gas, the inert gas, the second processing gas, and the inert gas are repeatedly fed in sequence into the processing chamber;

the inert gas fed into the inert gas feeding line is exhausted through said inert gas vent line without being fed into said processing chamber when the first processing gas is fed into the processing chamber through the first processing gas feeding line, and when the second processing gas is fed into the processing chamber through the second processing gas feeding line; and the first processing gas fed into the first processing gas feeding line is exhausted through the first processing gas vent line without being fed into the processing chamber, and the second processing gas fed into the second processing gas feeding line is exhausted through the second processing gas vent line without being fed into the processing chamber when the inert gas is fed into the processing chamber through the inert gas feeding line.

The controller preferably furthermore controls the flow rate controllers so that a total gas flow rate of the gas fed into the processing chamber is constant when the first processing gas, the inert gas, the second processing gas, and the inert gas are repeatedly fed in sequence into the processing chamber.

According to yet another aspect of the present invention, there is provided a method for manufacturing a semiconductor device comprising:

loading a substrate into a processing chamber;
processing the substrate in the processing chamber; and
unloading the substrate from the processing chamber after processing; wherein the processing the substrate includes:
feeding a processing gas into the processing chamber through a processing gas feeding line; and
feeding an inert gas into the processing chamber through an inert gas feeding line; and
in the feeding the processing gas, the inert gas fed into the inert gas feeding line is exhausted through an inert gas vent line provided in the inert gas feeding line without being fed into the processing chamber; and
in the feeding the inert gas, a flow of inert gas fed into the inert gas feeding line is switched from the flow toward the inert gas vent line to the flow toward an inside of the processing chamber.

A total gas flow rate of the gas fed into the processing chamber is preferably kept constant in the feeding of the processing gas and the feeding of the inert gas.

According to still another aspect of the present invention, there is provided a method for manufacturing a semiconductor device comprising:

loading a substrate into a processing chamber;
processing the substrate in the processing chamber; and
unloading the substrate from the processing chamber after processing; wherein in the processing the substrate, feeding a first processing gas into the processing chamber through a first processing gas feeding line, feeding inert gas into the processing chamber through an inert gas feeding line, feeding a second processing gas into the processing chamber through a second processing gas feeding line, and feeding the inert gas into the processing chamber through the inert gas feeding line, are set as one cycle, and this cycle is repeated multiple number of times, and in the feeding the first processing gas and the feeding the second processing gas, the inert gas fed into the inert gas feeding line is exhausted through an inert gas vent line provided in the inert gas feeding line without being fed into the processing chamber, and in the feeding the inert gas, a flow of the inert gas fed into the inert gas feeding line is switched from the flow toward the inert gas vent line to the flow toward an inside of the processing chamber.

A total gas flow rate of the gas fed into the processing chamber is preferably kept constant during the plurality of repetitions of the cycle.

According to yet another aspect of the present invention, there is provided a method for manufacturing a semiconductor device including:

loading a substrate into a processing chamber;
processing the substrate in the processing chamber; and
unloading the substrate from the processing chamber after processing; wherein the processing of the substrate includes:
feeding a processing gas into the processing chamber through a processing gas feeding line; and
feeding an inert gas into the processing chamber through an inert gas feeding line; and
in the feeding of the processing gas, the inert gas fed into the inert gas feeding line is exhausted through an inert gas vent line provided in the inert gas feeding line without being fed into the processing chamber, or a flow rate of the inert gas flowing into the processing chamber from the inert gas feeding line is reduced with respect to the flow rate of feeding of the inert gas; and
in the feeding the inert gas, a flow of inert gas fed into the inert gas feeding line is switched from the flow toward the inert gas vent line to the flow toward an inside of the processing chamber, or a flow rate of the inert gas flowing into the processing chamber through the inert gas feeding line is increased with respect to the flow rate for feeding the processing gas.

A total gas flow rate of the gas fed into the processing chamber is preferably kept constant in the feeding of the processing gas and the feeding of the inert gas.

According to still another aspect of the present invention, there is provided a method for manufacturing a semiconductor device comprising:

loading a substrate into a processing chamber; processing the substrate in the processing chamber; and
unloading the substrate from the processing chamber after processing; wherein in the processing the substrate, feeding a first processing gas into the processing chamber through a first processing gas feeding line, feeding inert gas into the processing chamber through an inert gas feeding line, feeding a second processing gas into the processing chamber through a second processing gas feeding line, and feeding the inert gas into the processing chamber through the inert gas feeding line, are set as one cycle, and this cycle is repeated multiple number of times, and in the feeding the first processing gas and the feeding the second processing gas, the inert gas fed into the inert gas feeding line is exhausted through an inert gas vent line provided in the inert gas feeding line without being fed into the processing chamber, and in the feeding the inert gas, a flow of the inert gas fed into the inert gas feeding line is switched from the flow toward the inert gas vent line to the flow toward an inside of the processing chamber.

A total gas flow rate of the gas fed into the processing chamber is preferably kept constant during the plurality of repetitions of the cycle.

What is claimed is:

1. A substrate processing apparatus comprising:
a processing chamber in which a substrate is processed;
a processing gas feeding line that feeds a processing gas into said processing chamber;
an inert gas feeding line that feeds an inert gas into said processing chamber;
an inert gas vent line provided in said inert gas feeding line, which exhausts said inert gas fed into said inert gas feeding line without feeding said inert gas into said processing chamber;
a first valve provided in said inert gas feeding line, on a downstream side of a part where said inert gas vent line is provided in said inert gas feeding line;
a second valve provided in said inert gas vent line;
a third valve provided in said processing gas feeding line;
an exhaust line that exhausts an inside of said processing chamber; and a main controller that is configured to control said first, second and third valves so that:
  processing is applied to said substrate by alternately repeating feed of said processing gas into said processing chamber through said processing gas feeding line, and feed of said inert gas into said processing chamber through said inert gas feeding line,
  said inert gas fed into said inert gas feeding line is exhausted through said inert gas vent line when said inert gas is not fed into said processing chamber through said inert gas feeding line; and
  a flow of said inert gas fed into said inert gas feeding line is switched from said flow toward said inert gas vent line to said flow toward said inside of said processing chamber when said inert gas is fed into said processing chamber through said inert gas feeding line.

2. A substrate processing apparatus comprising:
a processing chamber in which a substrate is processed;
a processing gas feeding line that feeds a processing gas into said processing chamber;
an inert gas feeding line that feeds an inert gas into said processing chamber;
an inert gas vent line provided in said inert gas feeding line, which exhausts said inert gas fed into said inert gas feeding line without feeding said inert gas into said processing chamber;
a first valve provided in said inert gas feeding line, on a downstream side of a part where said inert gas vent line is provided in said inert gas feeding line;
a second valve provided in said inert gas vent line;
a processing gas vent line provided in said processing gas feeding line, which exhausts said processing gas fed into said processing gas feeding line without feeding said processing gas into said processing chamber;
a third valve provided in said processing gas feeding line, on a downstream side of a part where said processing gas vent line is provided in said processing gas feeding line;
a fourth valve provided in said processing gas vent line;
an exhaust line that exhausts an inside of said processing chamber; and
a main controller that is configured to control said first, second, third and fourth valves so that:
  processing is applied to said substrate by alternately repeating feed of said processing gas into said processing chamber through said processing gas feeding line, and feed of said inert gas into said processing chamber through said inert gas feeding line,
  said inert gas fed into said inert gas feeding line is exhausted through said inert gas vent line without being fed into said processing chamber when said processing gas is fed into said processing chamber through said processing gas feeding line; and
  said processing gas fed into said processing gas feeding line is exhausted through said processing gas vent line without being fed into said processing chamber when said inert gas is fed into said processing chamber through said inert gas feeding line.

3. The substrate processing apparatus according to claim 2, wherein
a flow rate controller is provided in each of said processing gas feeding line and said inert gas feeding line; and
said main controller is configured to further control said flow rate controllers so as to make constant:
a total flow rate of a flow rate of said gas exhausted through said exhaust line and a flow rate of said gas exhausted through said inert gas vent line when said processing gas is fed into said processing chamber; and
a total flow rate of a flow rate of said gas exhausted through said exhaust line and a flow rate of said gas exhausted through said processing gas vent line when said inert gas is fed into said processing chamber; and so as to make constant:
a ratio between said flow rate of said gas exhausted through said exhaust line and said flow rate of said gas exhausted through said inert gas vent line when said processing gas is fed into said processing chamber; and
a ratio between said flow rate of said gas exhausted through said exhaust line and said flow rate of said gas exhausted through said processing gas vent line when said inert gas is fed into said processing chamber.

4. The substrate processing apparatus according to claim 2, wherein
a flow rate controller is provided in each of said processing gas feeding line and said inert gas feeding line; and
said main controller is configured to further control said flow rate controllers so that when said feed of said processing gas into said processing chamber through said processing gas feeding line, and said feed of said inert gas into said processing chamber through said inert gas feeding line are alternately repeated, a total gas flow rate of said gas fed into said processing chamber is kept constant.

5. A substrate processing apparatus comprising:
a processing chamber in which a substrate is processed;
a first processing gas feeding line that feeds a first processing gas into said processing chamber;
a second processing gas feeding line that feeds a second processing gas into said processing chamber;
an inert gas feeding line that feeds an inert gas into said processing chamber;
an inert gas vent line provided in said inert gas feeding line, which exhausts said inert gas fed into said inert gas feeding line without feeding said inert gas into said processing chamber;
a first valve provided in said inert gas feeding line, on a downstream side of a part where said inert gas vent line is provided in said inert gas feeding line;
a second valve provided in said inert gas vent line;
a first processing gas vent line provided in said first processing gas feeding line, which exhausts said first processing gas fed into said first processing gas feeding line without feeding said first processing gas into said processing chamber;
a second processing gas vent line provided in said second processing gas feeding line, which exhausts said second processing gas fed into said second processing gas feeding line without feeding said second processing gas into said processing chamber;
a third valve provided in said first processing gas feeding line, on a downstream side of a part where said first processing gas vent line is provided in said first processing gas feeding line;
a fourth valve provided in said first processing gas vent line;
a fifth valve provided in said second processing gas feeding line, on a downstream side of a part where said second processing gas vent line is provided in said second processing gas feeding line;
a sixth valve provided in said second processing gas vent line;
an exhaust line that exhausts an inside of said processing chamber; and
a main controller that is configured to control said first, second, third, fourth, fifth and sixth valves so that:

processing is applied to said substrate by setting feed of said first processing gas into said processing chamber through said first processing gas feeding line, feed of said inert gas into said processing chamber through said inert gas feeding line, feed of said second processing gas into said processing chamber through said second processing gas feeding line, and feed of said inert gas into said processing chamber from said inert gas feeding line, as one cycle and repeating this cycle a multiple number of times;

said inert gas fed into said inert gas feeding line is exhausted through said inert gas vent line without being fed into said processing chamber when said first processing gas is fed into said processing chamber through said first processing gas feeding line, and when said second processing gas is fed into said processing chamber through said second processing gas feeding line; and said first processing gas fed into said first processing gas feeding line is exhausted through said first processing gas vent line without being fed into said processing chamber, and said second processing gas fed into said second processing gas feeding line is exhausted through said second processing gas vent line without being fed into said processing chamber when said inert gas is fed into said processing chamber through said inert gas feeding line.

6. The substrate processing apparatus according to claim 5, wherein a flow rate controller is provided in each of said first processing gas feeding line, said second processing gas feeding line, and said inert gas feeding line, and said main controller is configured to further control said flow rate controllers so that when said cycle is repeated said multiple number of times a total gas flow rate of said gas fed into said processing chamber is constant.

7. The substrate processing apparatus according to claim 1, wherein a flow rate controller is provided in each of said processing gas feeding line and said inert gas feeding line; and said main controller is configured to further control said flow rate controllers so that when said feed of said processing gas into said processing chamber through said processing gas feeding line, and said feed of said inert gas into said processing chamber through said inert gas feeding line are alternately repeated, a total gas flow rate of said gas fed into said processing chamber is kept constant.

8. The substrate processing apparatus according to claim 2, wherein a flow rate controller is provided in each of said processing gas feeding line and said inert gas feeding line; and said main controller is configured to further control said flow rate controllers so as to make constant:

a total flow rate of a flow rate of said gas exhausted through said exhaust line and a flow rate of said gas exhausted through said inert gas vent line when said processing gas is fed into said processing chamber; and a total flow rate of a flow rate of said gas exhausted through said exhaust line and a flow rate of said gas exhausted through said processing gas vent line when said inert gas is fed into said processing chamber.

9. The substrate processing apparatus according to claim 2, wherein a flow rate controller is provided in each of said processing gas feeding line and said inert gas feeding line; and said main controller is configured to further control said flow rate controllers so as to make constant:

a ratio between a flow rate of said gas exhausted through said exhaust line and a flow rate of said gas exhausted through said inert gas vent line when said processing gas is fed into said processing chamber; and a ratio between a flow rate of said gas exhausted through said exhaust line and a flow rate of said gas exhausted through said processing gas vent line when said inert gas is fed into said processing chamber.

10. The substrate processing apparatus according to claim 5, wherein a flow rate controller is provided in each of said first processing gas feeding line, said second processing gas feeding line, and said inert as feeding line; and said main controller is configured to further control said flow rate controllers so as to make constant:

a total flow rate of a flow rate of said gas exhausted through said exhaust line, a flow rate of said gas exhausted through said inert gas vent line, and a flow rate of said gas exhausted through said second processing gas vent line when said first processing gas is fed into said processing chamber;

a total flow rate of a flow rate of said gas exhausted through said exhaust line, a flow rate of said gas exhausted through said first processing gas vent line, and a flow rate of said gas exhausted through said second processing gas vent line when said inert gas is fed into said processing chamber; and a total flow rate of a flow rate of said gas exhausted through said exhaust line, a flow rate of said gas exhausted through said inert gas vent line, and a flow rate of said gas exhausted through said first processing gas vent line when said second processing gas is fed into said processing chamber.

11. The substrate processing apparatus according to claim 5, wherein a flow rate controller is provided in each of said first processing gas feeding line, said second processing gas feeding line, and said inert gas feeding line; and said main controller is configured to further control said flow rate controllers so as to make constant:

a ratio between a flow rate of said gas exhausted through said exhaust line and a total flow rate of said gases exhausted through said inert gas vent line and said second processing gas vent line when said first processing gas is fed into said processing chamber;

a ratio between a flow rate of said gas exhausted through said exhaust line and a total flow rate of said gases exhausted through said first processing gas vent line and said second processing gas vent line when said inert gas is fed into said processing chamber; and a ratio between a flow rate of said gas exhausted through said exhaust line and a total flow rate of said gases exhausted through said inert gas vent line and said first processing gas vent line when said second processing gas is fed into said processing chamber.

12. The substrate processing apparatus according to claim 5, wherein a flow rate controller is provided in each of said first processing gas feeding line, said second processing gas feeding line, and said inert gas feeding line; and said main controller is configured to further control said flow rate controllers so as to make constant:

a total flow rate of a flow rate of said gas exhausted through said exhaust line, a flow rate of said gas exhausted through said inert gas vent line, and a flow rate of said gas exhausted through said second processing gas vent line when said first processing gas is fed into said processing chamber;

a total flow rate of a flow rate of said gas exhausted through said exhaust line, a flow rate of said gas exhausted through said first processing gas vent line, and a flow rate of said gas exhausted through said second processing gas vent line when said inert gas is fed into said processing chamber; and a total flow rate of a flow rate of said gas exhausted through said exhaust line, a flow rate of said gas exhausted through said inert gas vent line, and a flow rate of said gas exhausted through said first processing gas vent line when said second processing gas is fed into said processing chamber; and so as to make constant:

a ratio between a flow rate of said gas exhausted through said exhaust line and a total flow rate of said gases exhausted through said inert gas vent line and said second processing gas vent line when said first processing gas is fed into said processing chamber;

a ratio between a flow rate of said gas exhausted through said exhaust line and a total flow rate of said gases exhausted through said first processing gas vent line and said second processing gas vent line when said inert gas is fed into said processing chamber; and a ratio between a flow rate of said gas exhausted through said exhaust line and a total flow rate of said gases exhausted through said inert gas vent line and said first processing gas vent line when said second processing gas is fed into said processing chamber.

13. A substrate processing apparatus comprising:

a processing chamber in which a substrate is processed;

a first processing gas feeding line that feeds a first processing gas into said processing chamber;

a second processing gas feeding line that feeds a second processing gas into said processing chamber;

an inert gas feeding line that feeds an inert gas into said processing chamber;

an inert gas vent line provided in said inert gas feeding line, which exhausts said inert gas fed into said inert gas feeding line without feeding said inert gas into said processing chamber;

a first valve provided in said inert gas feeding line, on a downstream side of a part where said inert gas vent line is provided in said inert gas feeding line;

a second valve provided in said inert gas vent line;

a third valve provided in said first processing gas feeding line;

a fourth valve provided in said second processing gas feeding line;

an exhaust line that exhausts an inside of said processing chamber; and a main controller that is configured to control said first, second, third and fourth valves so that:

processing is applied to said substrate by setting feed of said first processing gas into said processing chamber through said first processing gas feeding line, feed of said inert gas into said processing chamber through said inert gas feeding line, feed of said second processing gas into said processing chamber through said second processing gas feeding line, and feed of said inert gas into said processing chamber through said inert gas feeding line, as one cycle and repeating this cycle a multiple number of times, said inert gas fed into said inert gas feeding line is exhausted through said inert gas vent line when said first processing gas is fed into said processing chamber through said first processing gas feeding line, or when said second processing gas is fed into said processing chamber through said second processing gas feeding line; and a flow of said inert gas fed into said inert gas feeding line is switched from said flow toward said inert gas vent line to said flow toward said inside of said processing chamber when said inert gas is fed into said processing chamber through said inert gas feeding line.

14. The substrate processing apparatus according to claim 13, wherein a flow rate controller is provided in each of said first processing gas feeding line, said second processing gas feeding line, and said inert gas feeding line; and said main controller is configured to further control said flow rate controllers so that when said cycle is repeated said multiple number of times, a total gas flow rate of said gas fed into said processing chamber is kept constant.

* * * * *